(12) United States Patent
Takemura et al.

(10) Patent No.: US 11,022,997 B2
(45) Date of Patent: Jun. 1, 2021

(54) SEMICONDUCTOR DEVICE, SIGNAL PROCESSING DEVICE, AND CONTROL METHOD OF SIGNAL PROCESSING DEVICE

(71) Applicant: RENESAS ELECTRONICS CORPORATION, Tokyo (JP)

(72) Inventors: Narihira Takemura, Tokyo (JP); Terunori Kubo, Tokyo (JP); Tetsuo Takahashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/783,599

(22) Filed: Feb. 6, 2020

(65) Prior Publication Data
US 2020/0264651 A1    Aug. 20, 2020

(30) Foreign Application Priority Data
Feb. 19, 2019    (JP) .............................. JP2019-027270

(51) Int. Cl.
*H03K 5/133*    (2014.01)
*G06F 1/08*    (2006.01)
*H03L 7/08*    (2006.01)

(52) U.S. Cl.
CPC ............... *G06F 1/08* (2013.01); *H03K 5/133* (2013.01); *H03L 7/08* (2013.01)

(58) Field of Classification Search
CPC .............. G06F 1/08; G06F 1/12; H03K 5/133
See application file for complete search history.

(56) References Cited

U.S. PATENT DOCUMENTS 6,924,679 B2 *   8/2005   Seno ..................... H03L 7/0996
                                                                    327/158

FOREIGN PATENT DOCUMENTS

JP            2010-287860 A      12/2010

* cited by examiner

*Primary Examiner* — Patrick O Neill
(74) *Attorney, Agent, or Firm* — McDermott Will & Emery LLP

(57) ABSTRACT

A signal processing device includes an oscillation circuit, a protection target circuit, a delay time detection circuit, and a clock control circuit. The oscillation circuit receives the frequency control signal and generates a clock signal having a frequency corresponding to the frequency control signal. According to the above-mentioned configuration, even when a delay failure due to aging occurs in the signal processing device, it is possible to prevent a malfunction.

14 Claims, 22 Drawing Sheets

- Related Art-

- Related Art-

SEMICONDUCTOR DEVICE, SIGNAL PROCESSING DEVICE, AND CONTROL METHOD OF SIGNAL PROCESSING DEVICE

CROSS-REFERENCE TO RELATED APPLICATIONS

The disclosure of Japanese Patent Application No. 2019-027270 filed on Feb. 19, 2019 including the specification, drawings and abstract is incorporated herein by reference in its entirety.

BACKGROUND

The present invention relates to a semiconductor device, a signal processing device, and a control method of the signal processing device, and, for example, to a clock control technique of the device and the device. For example, Japanese unexamined patent publication No. 2010-287860 discloses a semiconductor integrated circuit device including a delay fault detection circuit. The delay fault detection circuit has a plurality of signal delay paths, measures the magnitude relationship of the delay amount between the plurality of signal delay paths, and stores the measured relationship in a memory. Every time the delay amount is measured by the plurality of signal delay paths, the delay fault detection circuit detects the aging deterioration in the plurality of signal delay paths by comparing the magnitude relationship of the delay amount based on the measurement result with the magnitude relationship stored in the memory.

SUMMARY

For example, signal processing devices used in the field of automobiles and the like are required to have high reliability. Therefore, if a delay fault detection circuit as shown in Japanese unexamined patent publication No. 2010-287860 is provided, it becomes possible to detect the sign before a serious problem on the device occurs due to the aging deterioration. However, according to the article, although aging deterioration can be detected, it is not always possible to prevent malfunction of the device and secure safety.

That is, in order to prevent a malfunction, for example, it is necessary to duplicate the device so that the device can be switched in accordance with the detection of aging deterioration, or to request the user to replace a part at an early stage in accordance with the detection of aging deterioration. The duplexing of the device leads to an increase in cost, and also leads to a complicated control at the time of switching the device. On the other hand, when the user is requested to replace the component at an early stage, it is necessary to request the replacement of the part at a stage where a sufficient product life remains in practical use so as to maintain the safety before the replacement of the part. This results in increased costs. The embodiments described below have been made in view of the above, and other problems and novel features will be apparent from the description of the present specification and the accompanying drawings.

The signal processing device according to the embodiment includes an oscillation circuit, a protection target circuit, a delay time detection circuit, and a clock control circuit. The oscillation circuit receives the frequency control signal and generates a clock signal having a frequency corresponding to the frequency control signal. The protection target circuit operates based on the clock signal. The delay time detection circuit includes a test circuit element group reflecting the configuration of a predetermined circuit element group in the protection target circuit, and outputs a delay amount detection signal reflecting the delay time by detecting a delay time of a signal generated in the test circuit element group. The clock control circuit is provided outside the protection target circuit, and receives the delay amount detection signal, and generates a frequency control signal for declining the frequency of the clock signal in accordance with an increase in the delay time.

According to the above-mentioned embodiment, even when a delay failure due to aging occurs in the signal processing device, it is possible to prevent a malfunction.

DETAILED DESCRIPTION

Figure 1:
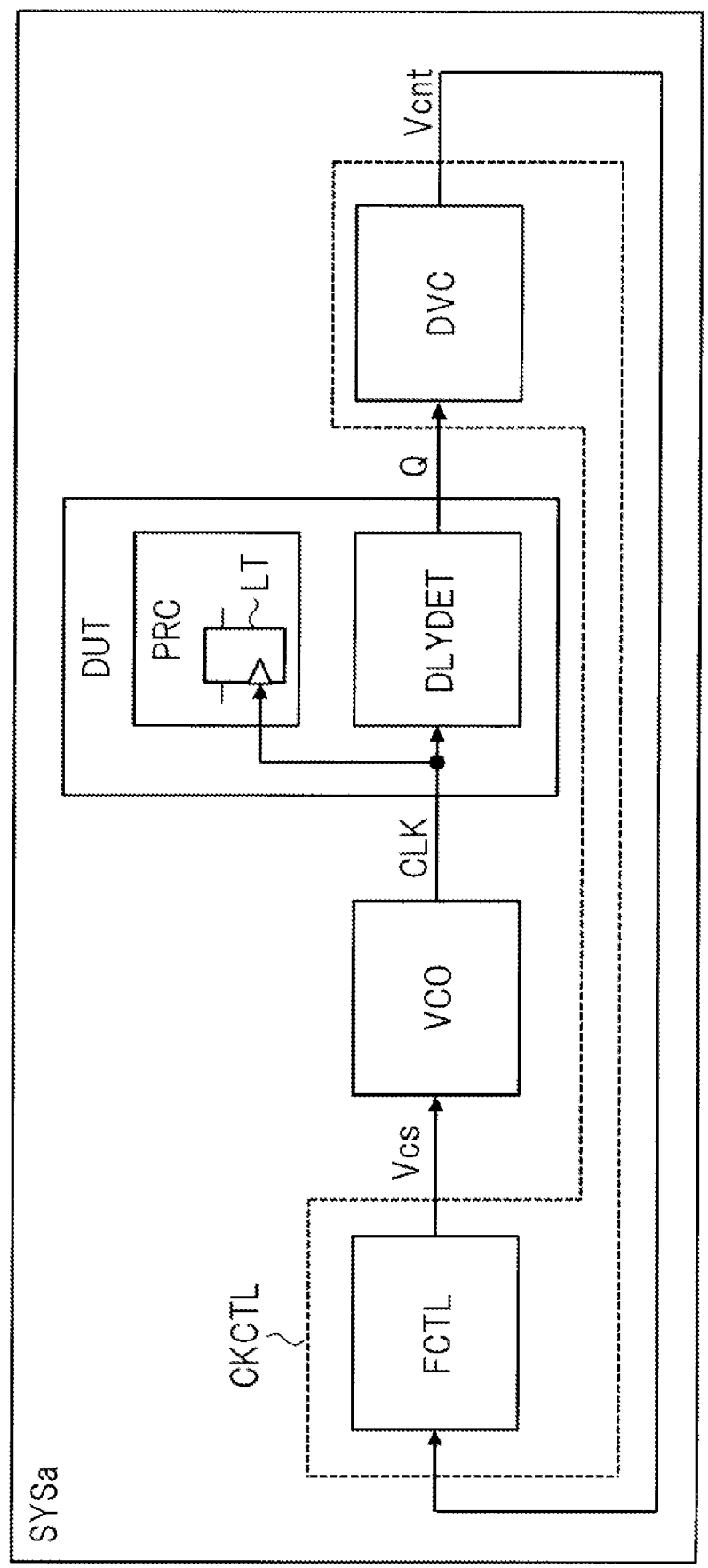
FIG. 1 is a block diagram showing a schematic configuration example of a signal processing device according to the first embodiment of the present invention.

In the following embodiments, when it is necessary for convenience, the description will be made by dividing into a plurality of sections or embodiments, but except for the case where it is specifically specified, they are not independent of each other, and one of them is related to some or all of modifications, details, supplementary description, and the like of the other. In the following embodiments, the number of elements or the like (including the number, number, quantity, range, and the like) is not limited to the specific number except the case where it is specified in particular or the case where it is obviously limited to the specific number in principle, and may be a specific number or more or less.

Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The circuit elements constituting the functional blocks of the embodiment are not particularly limited, but are formed on a semiconductor substrate such as a single-crystal silicon substrate by an integrated circuit technique such as a well-known complementary MOS transistor (CMOS).

Hereinafter, embodiments of the present invention will be described in detail with reference to the drawings. In all the drawings for explaining the embodiments, the same members are denoted by the same reference numerals in principle, and repetitive descriptions thereof are omitted.

Embodiment 1

(Outline of Signal Processing Device)

FIG. 1 is a block diagram showing a schematic configuration example of a signal processing device according to Embodiment 1 of the present invention. The signal processing device SYSa shown in FIG. 1 includes an oscillator circuit VCO, a circuit under test DUT, and a clock control circuit CKCTL. The oscillation circuit VCO receives the frequency control signal Vcs and generates a clock signal CLK having a frequency corresponding to the frequency control signal Vcs. The circuit-under-test DUT includes a circuit-under-protection PRC and a delay-time detecting circuit DLYDET.

The protection target circuit PRC operates based on the clock signal CLK, and includes, for example, a latch circuit LT that performs a latch operation in synchronization with the clock signal CLK, various combination circuits (not shown), and the like. Specifically, the protective circuit PRC is a microcomputer (MCU (Micro Controller Unit)) having a logic circuit and an analogue circuit, a CPU (Central Processing unit), various control logic circuits, or the like.

The delay time detecting circuit DLYDET detects a delay time of signals generated in a predetermined group of circuit elements in the protective circuit PRC. Specifically, the delay time detection circuit DLYDET includes a test circuit element group reflecting the configuration of a predetermined circuit element group in the protection-target circuit PRC, and outputs a delay detection signal Q reflecting the delay time by detecting a delay time of a signal generated in the test circuit element group. The delay amount detection signal Q is, for example, an analog signal having a pulse width reflecting a delay time. Here, at least the protection-target circuit PRC and the delay-time detecting circuit DLYDET are mounted on the same semiconductor chip. The delay detecting circuit DLYDET is provided, for example, inside the protection target circuit PRC or in the vicinity of the protection target circuit PRC.

The clock control circuit CKCTL is provided outside the protection-target circuit PRC, and receives the delay detection signal Q to generate a frequency control signal Vcs for decreasing the frequency of the clock signal CLK in accordance with an increase in the delay time. In this embodiment, the clock-control circuit CKCTL includes a delay-amount-voltage converter circuit DVC and a frequency-control circuit FCTL. The delay amount voltage converter DVC converts the delay amount detection signal Q into a delay amount detection voltage Vcnt having a voltage value corresponding to the pulse width of the delay amount detection signal Q. The frequency control circuit FCTL generates a frequency control signal Vcs for decreasing the frequency of the clock signal CLK in response to an increase in the delay time based on the delay amount detection voltage Vcnt.

For example, the frequency control signal Vcs is an analog voltage, and the oscillation circuit VCO is a voltage controlled oscillator.

As described above, the signal processing device SYSa of FIG. 1 constitutes a feedback control device that controls the frequency of the clock signal CLK supplied to the protection target circuit RPC based on the delay time of the signal generated in the protection target circuit RPC, which is actually the delay time detecting circuit DLYDET. Specifically, the device lowers the frequency of the clock signal CLK in accordance with an increase in the delay time. Therefore, even when the delay time increases due to the aging deterioration, in other words, when the delay failure occurs, the protection target circuit PRC can continue the operation substantially equivalent to the normal operation without malfunctioning.

The oscillator circuit VCO, the circuit under test DUT, and the clock control circuit CKCTL shown in FIG. 1 are formed of, for example, one semiconductor chip (semiconductor device) in order to enable miniaturization and mass production of the signal processing device SYSa. However, the present invention is not limited thereto, and a signal processing device may be configured by a plurality of semiconductor chips.

(Details of the Delay Time Detection Circuit)

Figure 2:
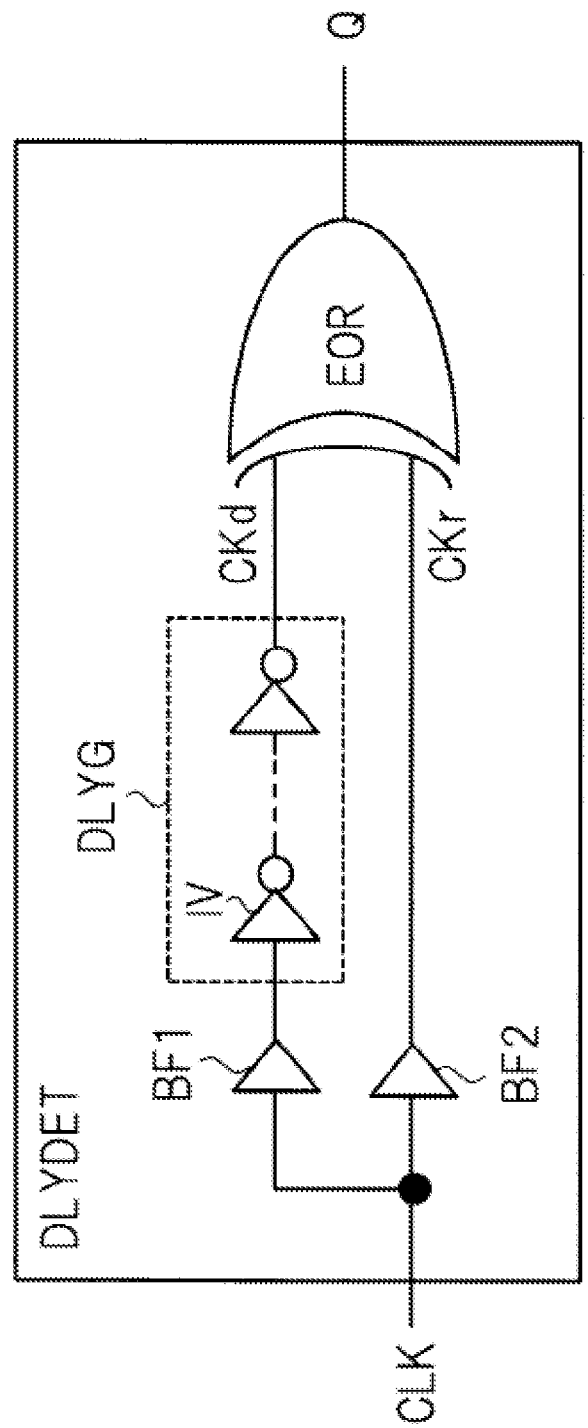
FIG. 2 is a circuit diagram showing a configuration example of a delay time detection circuit in the signal processing device of FIG. 1.
Figure 3:
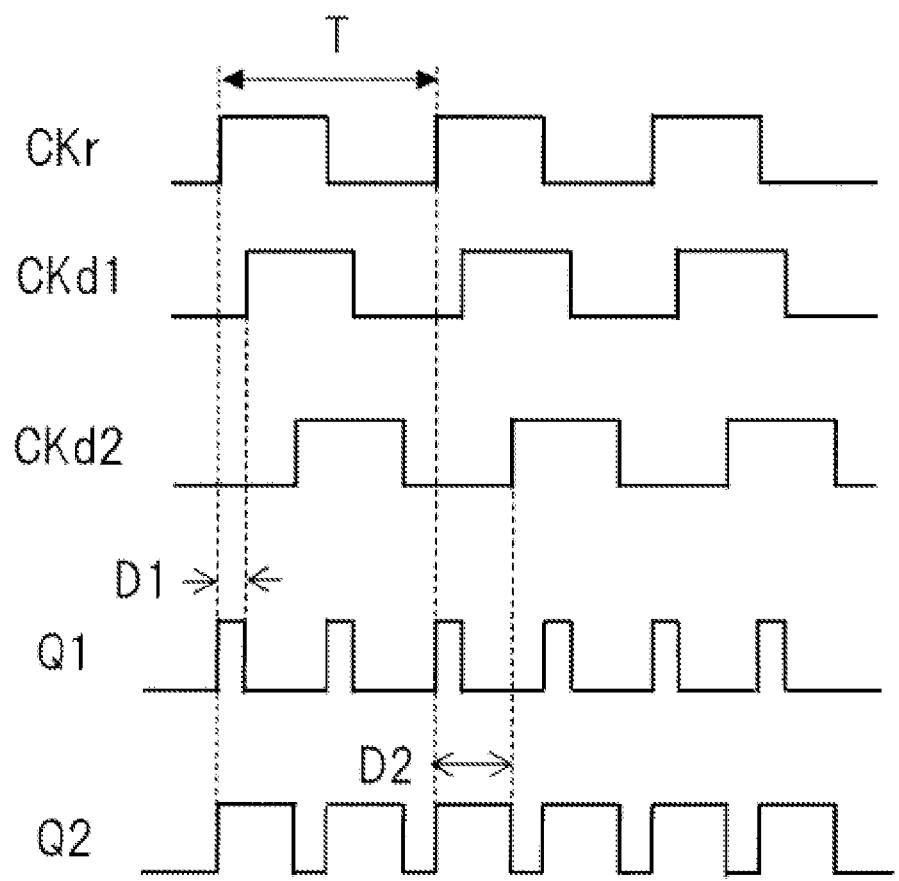
FIG. 3 is a timing chart showing an operation example of the delay time detection circuit of FIG. 2.

FIG. 2 is a circuit diagram showing a configuration example of a delay time detection circuit in the signal processing device of FIG. 1. FIG. 3 is a timing chart showing an operation example of the delay time detection circuit of FIG. 2. The delay detecting circuit DLYDET of FIG. 2 includes a logic operation circuit EOR, a delay generating circuit DLYG, and two buffers BF1,BF2. The delay generator DLYG generates the delayed clock signal CKd by delaying the clock signal CLK inputted through the buffers BF1.

The logic operation circuit EOR performs a logic operation (EXOR operation) using the clock signal CKr and the delayed clock signal CKd input through the buffer BF2 as input, thereby detecting a time difference between the clock signal CKr and the delayed clock signal CKd. Then, as shown in FIG. 3, the logic operation circuit EOR outputs, as the delay amount detection signal Q, a signal having a pulse width D based on the detected time difference at the same frequency (period T) as the clock signal CLK. In other words, the logic operation circuit EOR is a signal representing the ratio of the time difference (pulse width D) with respect to the cycle T of the clock signal as the delay amount detection signal Q, and outputs a signal having a duty ratio of "D/T".

Here, the delay generation circuit DLYG is composed of a test circuit element group in which the configuration of a predetermined circuit element group in the protection-target circuit PRC is reflected. The inspection circuit element group (predetermined circuit element group in the protection target circuit PRC) is a circuit group in which an increase in delay time due to aging is predicted, and is determined in advance as an observation target by a designer or the like. The test circuit element group is arranged in the protection target circuit PRC or in the vicinity of the protection target circuit PRC so as to faithfully reproduce the degree of deterioration of a predetermined circuit element group in the protection target circuit PRC. Here, as an example, the test circuit element group includes a plurality of stages of inverter circuits IV. However, the test circuit element group is not limited to this, and the test circuit element group may have a configuration in which various logic operation circuits such as inverters, NAND operation circuits, NOR operation circuits, and the like are combined as appropriate and directly connected to each other.

FIG. 3 shows the delayed clock signal CKd1 when the aging deterioration does not occur and the delayed clock signal CKd2 when the delay time increases with the aging deterioration. The pulse width D2 of the delay amount detection signal Q2 obtained by the delay clock signal CKd2 is larger than the pulse width D1 of the delay amount detection signal Q1 obtained by the delay clock signal CKd1. As described above, as the aging deterioration progresses, the duty ratio of the delay amount detection signal Q increases.

(Details of the Delay Voltage Conversion Circuit)

Figure 4:
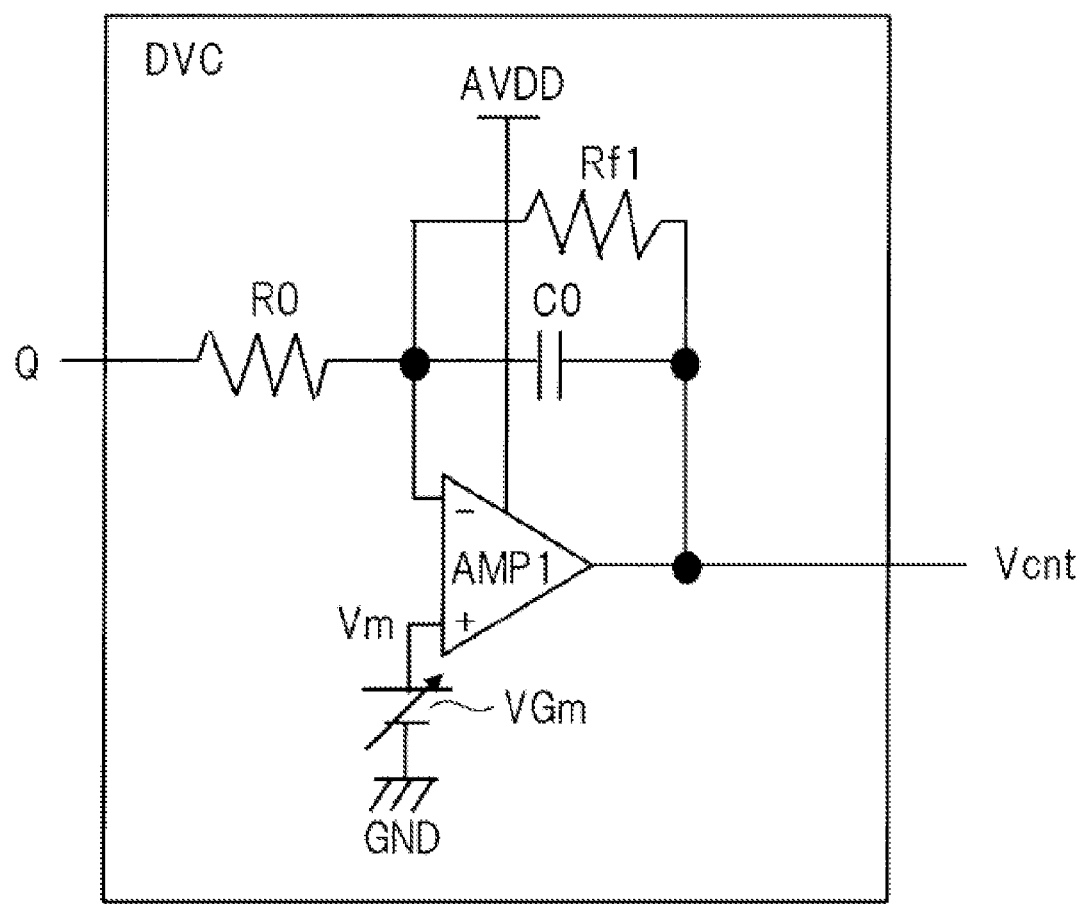
FIG. 4 is a circuit diagram showing a configuration example of a delay amount voltage conversion circuit in the signal processing device of FIG. 1.

FIG. 4 is a circuit diagram showing a configuration example of a delay amount voltage conversion circuit in the signal processing device of FIG. 1. The delay amount voltage converter circuit DVC shown in FIG. 4 is an active low-pass filter circuit that averages the delay amount detection signals Q from the delay time detection circuit DLY-DET. Specifically, the delay amount voltage converter circuit DVC includes an integrating circuit having a negative feedback configuration including an operational amplifier AMP1, an input resistor R0, a feedback capacitor C0, and a variable voltage source VGm, and a feedback resistor Rf1. The variable voltage source VGm generates a voltage Vm with reference to the ground power supply voltage GND. The operational amplifiers AMP1 are supplied with power supply voltages AVDD.

An input current corresponding to the difference between the voltage of the delay amount detection signal Q and the voltage Vm flows through the input resistor R0. The input current flows through the feedback resistor Rf1 and is accumulated in the feedback capacitor C0. When the steady-state is reached, generally, the average current of the input current flows through the feedback resistor Rf1, and the difference current between the input current and the average current is charged and discharged by the feedback capacitor C0. Therefore, as the duty ratio of the delay amount detection signal Q increases, the mean current increases, and the delay amount detection voltage Vcnt decreases via the feedback resistor Rf1. The level of the mean current and thus the level of the delay detection voltage Vcnt are also controlled by the voltage Vm.

Figure 5:
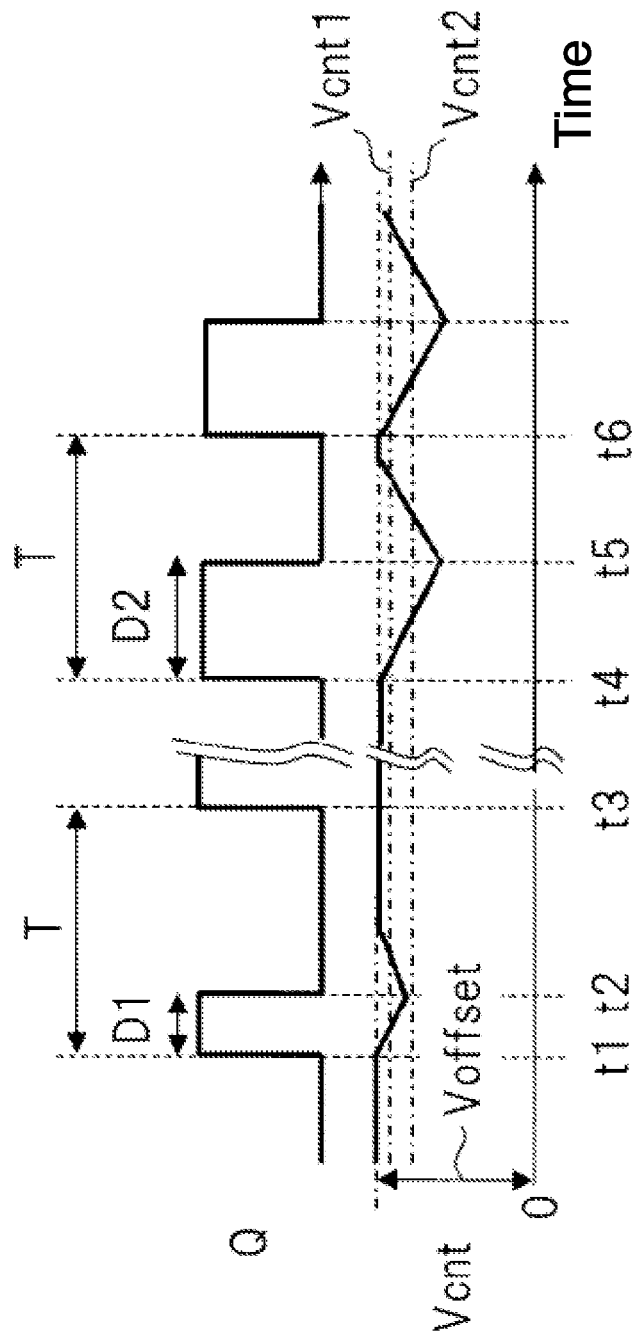
FIG. 5 is a waveform diagram showing an example of the operation of the integration circuit in the delay amount voltage conversion circuit of FIG. 4.

FIG. 5 is a waveform diagram showing an operation example of the integration circuit in the delay amount voltage conversion circuit of FIG. 4. As shown in FIG. 5, when the delay amount detection signal Q is not inputted, the operational amplifier AMP1 outputs the offset voltage Voffset as the delay amount detection signal Vcnt. The offset voltage Voffset can be set by, for example, the offset voltage Vm. When the delay amount detection signal Q is inputted, the delay amount detection voltage Vcnt is lowered by the function of the integrating circuit in the "H" level period (period from time t1 to t2) of the pulse width D1 and the "H" level period (period from time t4 to t5) of the pulse width D2. On the other hand, in the "L" level period (the period from time t2 to t3 and the period from time t5 to t6), the delay detecting voltage Vcnt rises toward the offset voltage Voffset due to the function of the integrator.

As a result, the mean voltage value of the delay detecting voltage Vcnt becomes "Vcnt1" in the period T (period from time t1 to t3) of the clock signal CLK including the pulse width D1, and becomes "Vcnt2" in the period T (period from time t4 to t6) of the clock signal CLK including the pulse width D2. Here, the pulse width D2 is larger than the pulse width D1. Therefore, "Vcnt2" is lower than "Vcnt1".

Figure 6:
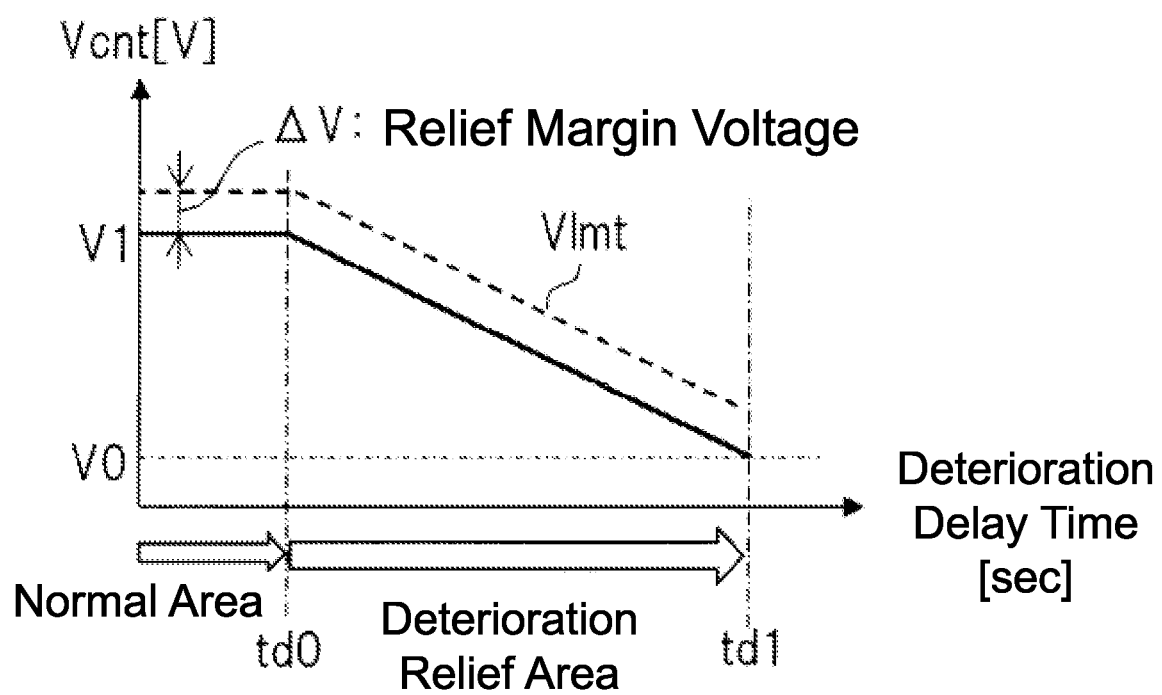
FIG. 6 is a diagram showing an example of the relationship between the deterioration delay time detected by the delay time detection circuit and the delay amount detection voltage in FIG. 1.

FIG. 6 is a diagram showing an example of the relationship between the deterioration delay time detected by the delay time detection circuit and the delay amount detection voltage in FIG. 1. In FIG. 6, the deterioration delay time "td0" is a delay time (for example, corresponding to the pulse width D1 in FIG. 3) when it is assumed that the delay due to the aging deterioration does not occur in the delay generation circuit DLYG in FIG. 2. Further, the deterioration delay time "td1" is a delay time (for example, corresponding to the pulse width D2 in FIG. 3) when a delay due to the aging deterioration occurs in the delay generation circuit DLYG. When the deterioration delay time increases from "td0" to "td1", the delay detection voltage Vcnt decreases from "V1" to "V0" in accordance with the increase in the deterioration delay time.

Here, the frequency of the clock signal CLK is controlled so that the frequency of the clock signal CLK is proportional to the magnitude of the delay detecting voltage Vcnt. In the case of FIG. 6, the area exceeding the deterioration delay time "td0" is a deterioration relief area in which the frequency of the clock signal CLK is reduced in accordance with the detection delay voltage Vcnt to thereby perform relief. On the other hand, a area in which the deterioration delay time "td0" is not reached is a normal area in which the deterioration delay time is operated at a constant frequency.

FIG. 6 shows the threshold delay voltages Vlmt determined on the basis of the frequencies of the clock signals CLK. The threshold delay voltage Vlmt is a voltage corresponding to the maximum clock frequency at which the protective circuits PRCs can operate for the respective deterioration delay times. As shown in FIG. 6, the characteristics of the delay amount detecting voltage Vcnt are determined so as to be lower than the threshold delay amount voltage Vlmt by the relief marginal voltage ΔV. In other words, the frequency of the clock signal CLK actually generated is determined to be lower than the maximum clock frequency by a frequency corresponding to the relief margin voltage ΔV.

More specifically, the relief margin voltage ΔV is set to a minimum necessary level so that the signal processing device can stably operate even when the protection target circuit PRC has a variation in device temperature, a variation in power supply voltage, a manufacturing variation, and the like. The relief margin voltage ΔV can be adjusted by, for example, the voltage Vm from the variable voltage source VGm in FIG. 4. However, in some cases, the variable voltage source VGm of FIG. 4 may be a fixed voltage source in which an optimal output voltage is set in advance. The relief margin voltage ΔV may be set by a level shift circuit LS (see FIG. 8) in a frequency control circuit FCTL (to be described later).

Figure 7:
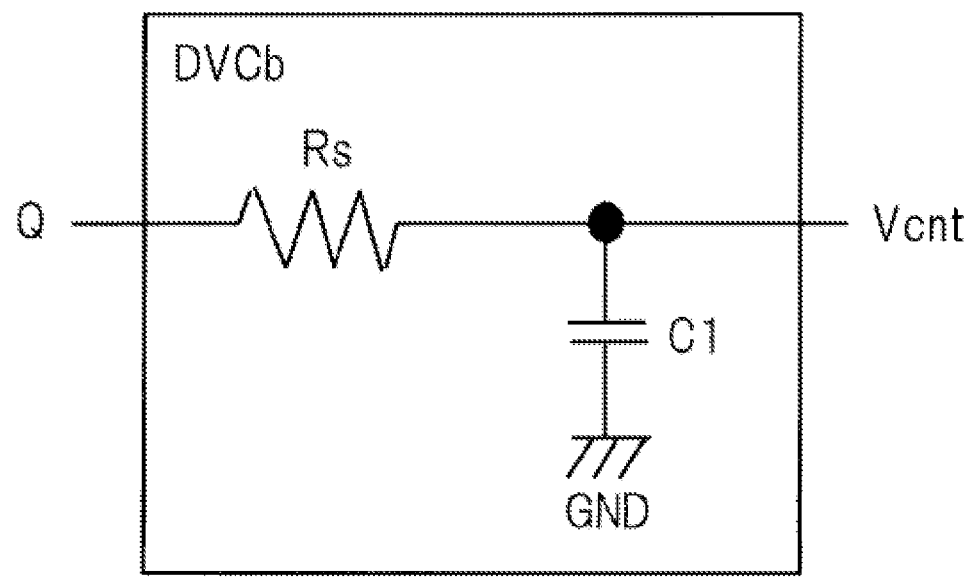
FIG. 7 is a circuit diagram showing another configuration example of the delay amount voltage conversion circuit in the signal processing device of FIG. 1.

Further, the delay amount voltage conversion circuit DVC may have any function as long as it has a function of converting the magnitude of the pulse width of the delay amount detection signal Q into a DC voltage value, and is not particularly limited to the configuration example of FIG. 4, and can be realized by various circuits including, for example, a circuit as shown in FIG. 7. FIG. 7 is a circuit diagram showing another configuration example of the delay amount voltage conversion circuit in the signal processing device of FIG. 1. The delay amount voltage converter circuit DVCb shown in FIG. 7 is a passive low-pass filter circuit that averages the delay amount detection signals Q from the delay time detection circuit DLYDET by the resistor Rs and the capacitor C1.

(Details of the Frequency Control Circuit)

Figure 8:
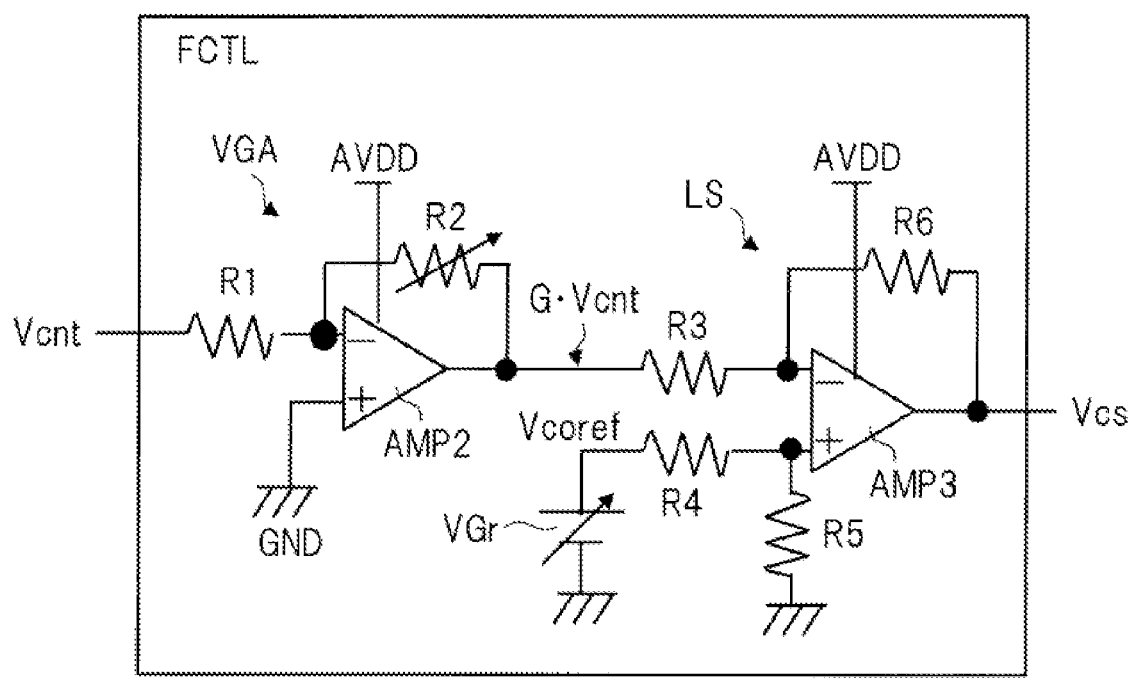
FIG. 8 is a circuit diagram showing a configuration example of a frequency control circuit in the signal processing device of FIG. 1.

FIG. 8 is a circuit diagram showing a configuration example of a frequency control circuit in the signal processing device of FIG. 1. The frequency control circuit FCTL shown in FIG. 8 includes a gain adjusting circuit VGA and a level shifting circuit LS. The gain adjusting circuit VGA is, for example, an inverting amplifier including a resistor R1, a feedback resistor R2, and an operational amplifier AMP2. The operational amplifiers AMP2 are supplied with power supply voltages AVDD. The gain adjusting circuit VGA inverts and amplifies the delay amount detecting voltage Vcnt from the delay amount voltage converting circuit DVC with the gain G (=−r2/r1) by setting the resistance values of the resistors R1 and R2 to r1 and r2. In this example, the gain G is variably controlled by making the feedback resistor R2 a variable resistor. However, a fixed resistor determined in advance so as to achieve an optimum gain may be used.

The level shift circuit LS is, for example, a differential amplifier including resistors R3 to R5, a feedback resistor R6, an operational amplifier AMP3, and a variable voltage source VGr. The operational amplifiers AMP3 are supplied with power supply voltages AVDD. The variable voltage source VGr generates a voltage Vcoref reference on the ground power supply voltage GND. The level shifting circuit LS adjusts the bias level of the output voltage G×Vcnt of the gain adjusting circuit VGA to generate the frequency control signal Vcs. Specifically, for example, when the resistors R3 to R6 are set to the same resistance values, the differential amplifier outputs "Vcoref−(G×Vcnt)". That is, the differential amplifiers invert the output voltage (G×Vcnt) of the gain adjuster VGA and level-shift the inverted output voltage by the voltage Vcoref to generate the frequency control signal Vcs. The variable voltage source VGr may be a fixed voltage source in which an optimum output voltage is set in advance.

Figure 9:
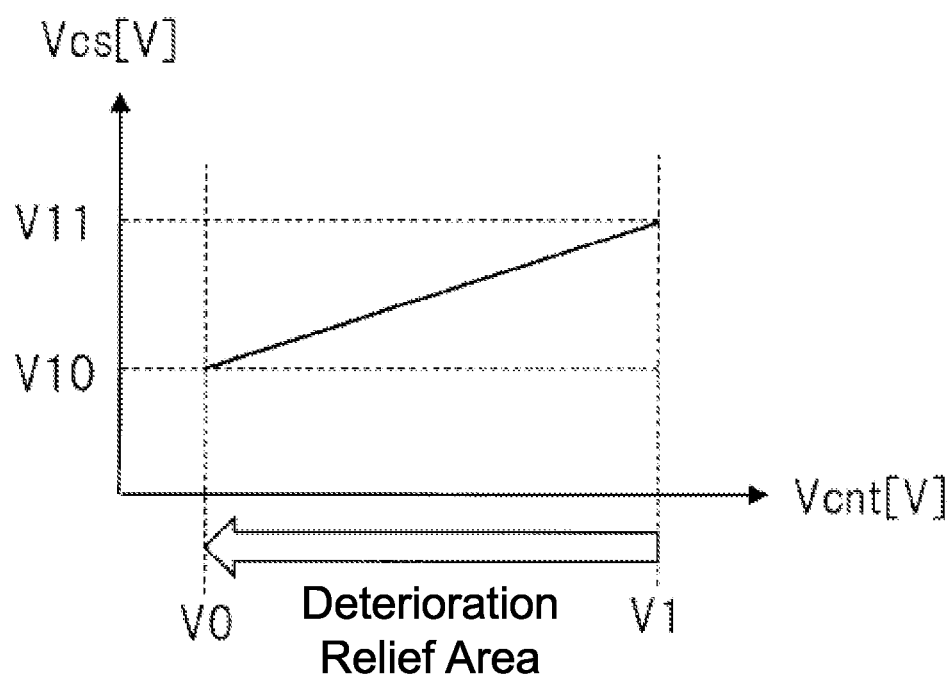
FIG. 9 is a diagram showing an example of the relationship between the delay amount detection voltage and the frequency control signal in the frequency control circuit of FIG. 8.

FIG. 9 is a diagram showing an example of the relationship between the delay amount detection voltage and the frequency control signal in the frequency control circuit of FIG. 8. As shown in FIG. 9, when the delay detecting voltage Vcnt decreases from "V1" to "V0" in accordance with an increase in the delay time, the frequency control signal Vcs (here, the DC voltage) also decreases from "V11" to "V10" in accordance with the decrease in the delay time. As shown in FIG. 8, the delay detection voltage Vcnt is transmitted through the negative input terminals (−) of the two operational amplifiers AMP2,AMP3. Therefore, the delay detection voltage Vcnt and the frequency control signal Vcs are directly proportional to each other. In FIG. 9, the sensitivity of the frequency control signal Vcs to the delay detection voltage Vcnt is adjusted by the gain adjusting circuit VGA. The voltage range of the frequency control signal Vcs is adjusted by the level shift circuit LS.

The frequency control circuit FCTL is not limited to the configuration of FIG. 8, and can be applied to the gain adjusting circuit VGA as long as the delay detecting voltage Vcnt can be amplified, and can be applied to the level shifting circuit LS as long as the bias level of the frequency control signal Vcs can be adjusted. For example, as the gain adjustment circuit VGA, a non-inverting amplifier or the like may be used instead of the inverting amplifier. As the level shift circuit LS, a transistor circuit of a source follower or the like may be used.

(Details of the Oscillator Circuit)

Figure 10:
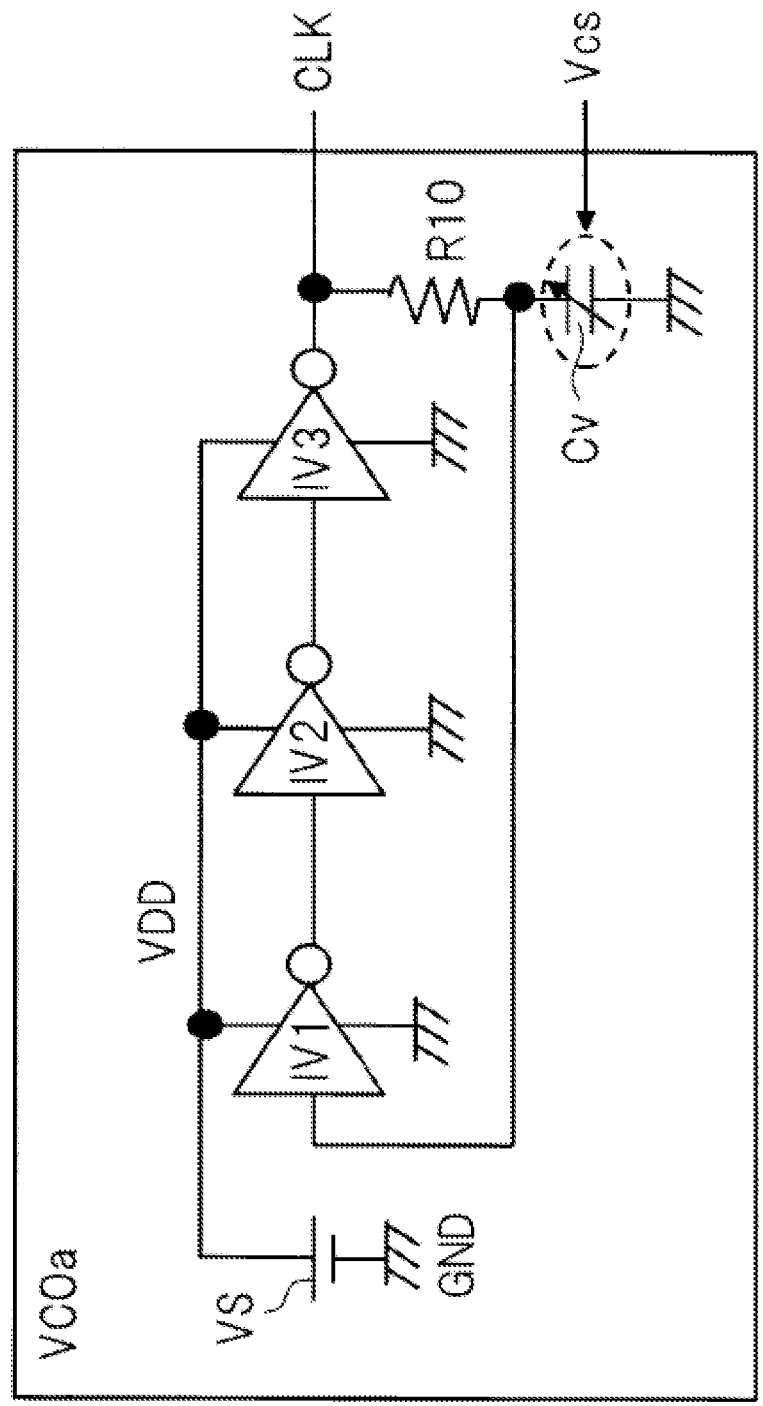
FIG. 10 is a circuit diagram showing a configuration example of an oscillation circuit in the signal processing device of FIG. 1.
Figure 11:
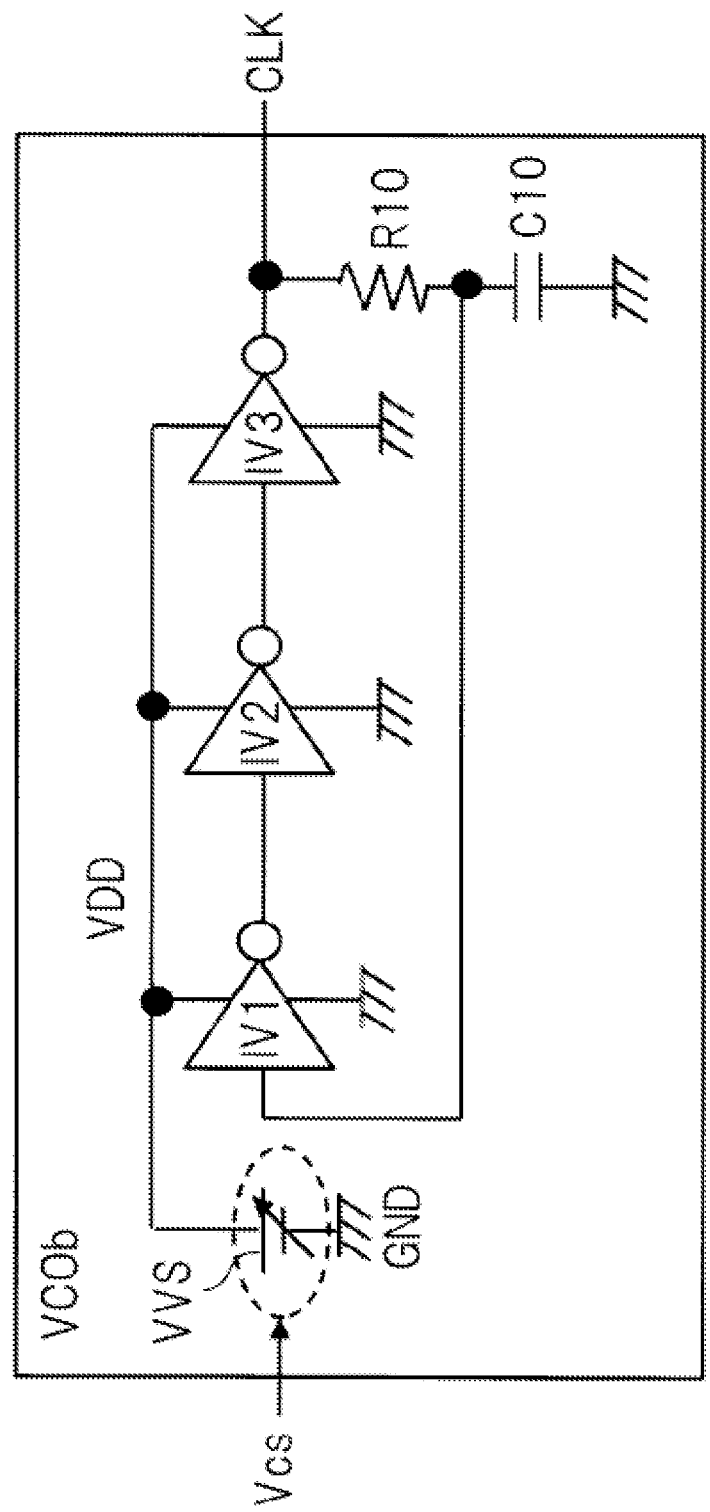
FIG. 11 is a circuit diagram showing another configuration example of the oscillation circuit in the signal processing device of FIG. 1.

FIG. 10 is a circuit diagram showing a configuration example of an oscillation circuit in the signal processing device of FIG. 1. FIG. 11 is a circuit diagram showing another configuration example of the oscillation circuit in the signal processing device of FIG. 1. The oscillator VCOa, VCOb shown in FIGS. 10 and 11 is a voltage-controlled oscillator. The oscillator circuit VCOa of FIG. 10 includes a plurality of cascaded inverter circuits IV1-IV3, a resistor R10 and a variable capacitor Cv for delaying the clock signal CLK outputted from the inverter circuit IV3 of the last stage and feeding the delayed clock signal CLK back to the inverter circuit IV1 of the first stage. The power supply voltage VDD from the voltage source VS is supplied to the plurality of stages of inverter circuits IV1-IV3.

The capacitance value of the variable capacitor Cv is controlled by the frequency control signal Vcs. As a result, the delay time of the signal inputted from the inverter circuit IV3 of the last stage to the inverter circuit IV1 of the first stage changes, and the frequency of the clock signal CLK can be changed. Specifically, for example, when the delay time detected by the delay time detecting circuit DLYDET increases, the voltage level of the frequency control signal Vcs decreases. In response to this, the capacitance of the variable capacitance Cv increases, and the delay time of the signal transmitted from the inverter circuit IV3 to the inverter circuit IV1 increases, so that the frequency of the clock signal CLK decreases.

On the other hand, the oscillator VCOb shown in FIG. 11 includes a fixed capacitor C10 instead of the variable capacitor Cv in FIG. 10, and includes a variable voltage source VVS instead of the voltage source VS. The power supply voltage VDD from the variable voltage source VVS is controlled by the frequency control signal Vcs. Since the delay time of the signal in the inverter circuit IV1-IV3 depends on the power supply voltage VDD, the frequency of the clock signal CLK can be changed by controlling the power supply voltage VDD. Specifically, for example, when the delay time detected by the delay time detecting circuit DLYDET increases, the voltage level of the frequency control signal Vcs decreases. In response to this, when the variable voltage source VVS lowers the power supply voltage VDD, the delay times of the signals in the respective inverter circuits IV1-IV3 increase, so that the frequency of the clock signal CLK decreases.

Figure 12:
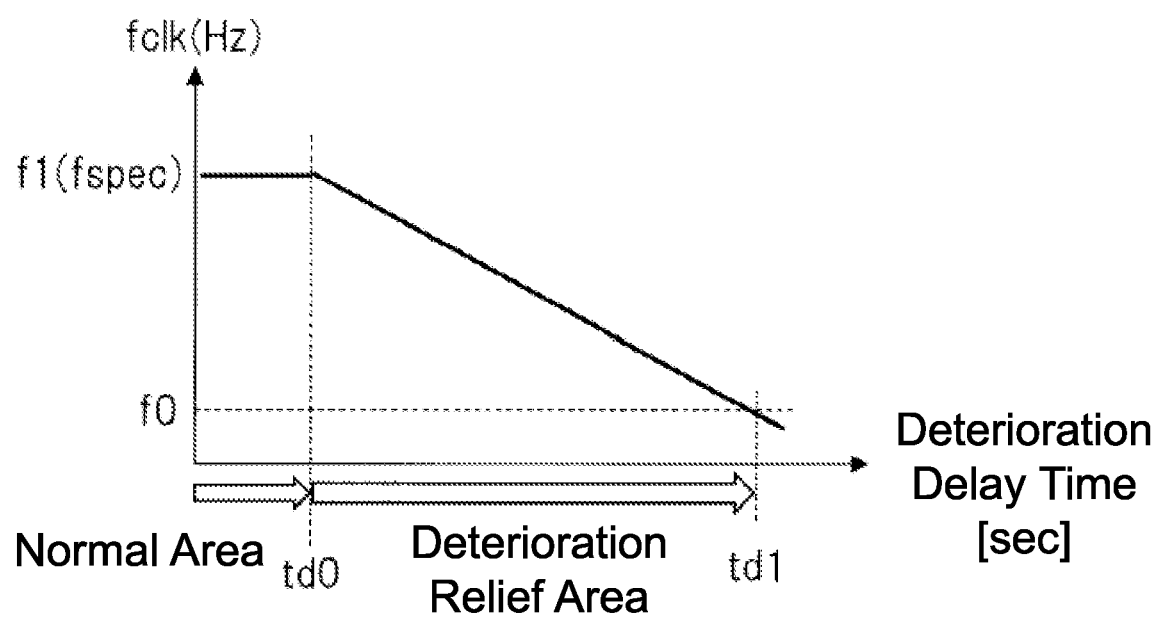
FIG. 12 is a diagram showing an example of the frequency characteristic of the clock signal with respect to the deterioration delay time detected by the delay time detection circuit in FIG. 1.

FIG. 12 is a diagram showing an example of the frequency characteristic of the clock signal with respect to the deterioration delay time detected by the delay time detection circuit in FIG. 1. As shown in FIG. 6, when the deterioration delay time detected by the protective circuit PRC (actually, the delay time detection circuit DLYDET) increases from "td0" to "td1", the delay detection voltage Vcnt decreases from "V1" to "V0". When the delay detecting voltage Vcnt decreases from "V1" to "V0", the voltage level of the frequency control signal Vcs decreases from "V11" to "V10" as shown in FIG. 9. That is, when the deterioration delay time detected by the protected circuit PRC increases from "td0" to "td1", the voltage level of the frequency control signal Vcs decreases from "V11" to "V10". As a result, as shown in FIG. 12, the frequency fclk of the clock signal CLK decreases from "f1" to "f0" in accordance with the decrease of the voltage level of the clock signal CLK from "V11" to "V10" of the voltage level of the frequency control signal Vcs.

As described above, when the signal processing device according to the first embodiment is used, the frequency fclk of the clock signal CLK can be automatically decreased in accordance with an increase in the delay time detected by the protection target circuit PRC. As a result, in the protection target circuit PRC, even when the delay time increases with the aging deterioration, in other words, when the delay failure occurs, it is possible to prevent the malfunction.

In the product of FIG. 12, as described in FIG. 6, the clock signal CLK is set to a predetermined frequency f1 (fspec) based on the normal specifications of the clock signal CLK, for example, in the area where the deterioration delay time is smaller than "td0". On the other hand, when the deterioration delay time increases beyond "td0", the frequency fclk of the clock signal CLK continuously decreases as the deterioration delay time increases. When the deterioration delay time further increases and reaches "td1", the signal processing device determines that the product life of the circuit-to-be-protected PRC has been reached, and the signal processing device stops generating the clock signal CLK. As described above, the area in which the deterioration delay time is "td0" ~"td1" is a deterioration relief area for preventing a malfunction and ensuring, for example, the safety of the device, instead of lowering the throughput of the device.

(Modifications of the Signal Processing Device)

As described above, although the signal processing device SYSa of FIG. 1 is composed of an analogue circuit in this embodiment, part or all of the signal processing device can be replaced by a digital circuit. For example, a Digitally Controlled Oscillator may be used as the oscillator circuit VCO instead of the voltage-controlled oscillator, and the frequency control circuit FCTL may be configured as a digital circuit. In this instance, the frequency control circuit FCTL converts, for example, the output voltage of the delay voltage converter circuit DVC into a digital signal by an analog-to-digital converter, and outputs the frequency control signal Vcs as a digital signal by performing various arithmetic processes. The DCO generates a clock signal CLK having a frequency corresponding to the digital signal. In some cases, the delay amount voltage conversion circuit DVC may be configured by a digital filter or the like, and the delay amount detection signal Q may be a digital signal representing the value of the duty ratio.

When such digital circuits are used, for example, the relationship between the deterioration delay times and the frequency fclk of the clock signal CLK shown in FIG. 12 becomes discrete in accordance with the resolution of the analog-to-digital converter, the resolution of the clock signal CLK, and the like. Therefore, although a digital circuit can be used, from the viewpoint of controlling the frequency fclk of the clock signal CLK with high resolution and seamlessly, it is more desirable to configure the signal processing device SYSa by an analogue circuit. Further, by using the analog circuit, the control delay can be reduced and the response speed can be increased as compared with the case of using the digital circuit.

(Control Flow of Signal Processing Device)

Figure 13:
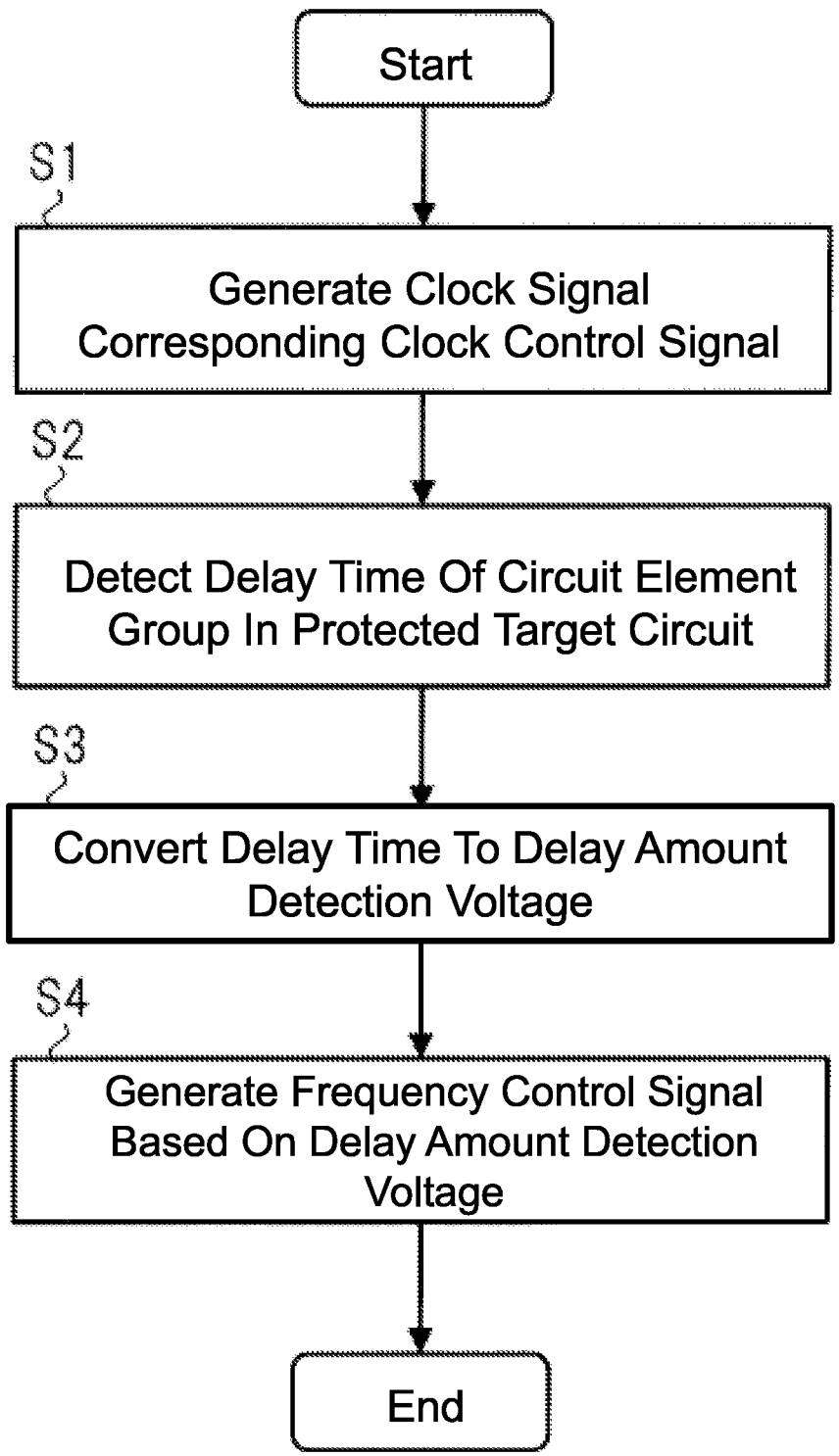
FIG. 13 is a flowchart showing an example of a control procedure in the control method of the signal processing device according to the first embodiment of the present invention.

FIG. 13 is a flowchart showing an example of a control procedure in the control method of the signal processing device according to the first embodiment of the present invention. In FIG. 13, first, in operation S1, the oscillator VCO generates a clock signal CLK having a frequency fclk corresponding to the frequency control signal Vcs. Next, the delay time detection circuit DLYDET detects a delay time of a signal generated in a predetermined group of circuit elements in the protection-target circuit RPC, and outputs a delay detection signal Q in operation S2.

In operation S3, the delay amount voltage converter DVC converts the delay amount detection signal Q into a delay amount detection voltage Vcnt having a voltage value corresponding to the pulse width D of the delay amount detection signal Q. Thereafter, the clock control circuit CKCTL generates a frequency control signal Vcs for decreasing the frequency of the clock signal CLK in accordance with the increase in the delay time based on the detection delay voltage Vcnt in operation S4.

(Outline of the Signal Processing Device (Comparative Example))

Figure 21:
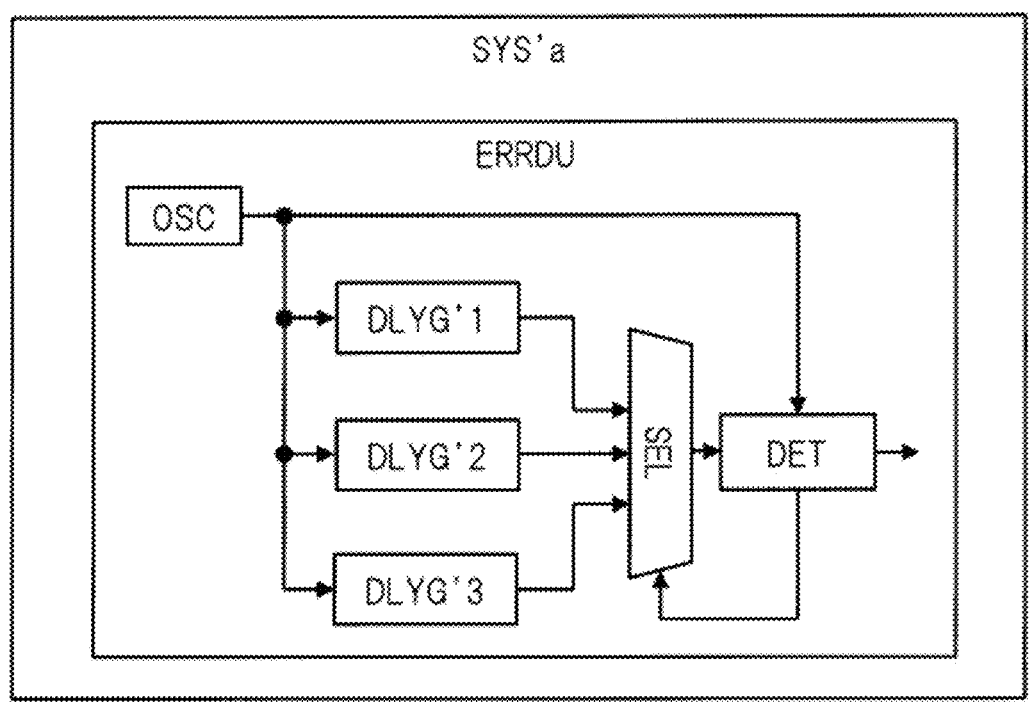
FIG. 21 is a block diagram showing a schematic configuration example of a signal processing device as a first comparative example of the present invention.

FIG. 21 is a block diagram showing a schematic configuration example of a signal processing device as a first comparative example of the present invention. The signal processing device SYS'a of the first comparative example includes a fault detecting unit ERRDU. The failure detection unit ERRDU includes an oscillator OSC, a plurality of delay generation circuits DLYG'1~DLYG'3, selectors SEL, and a delay failure detection circuit DET. The fault detecting unit ERRDU detects the magnitude relation between the plurality of delay generating circuits (signal delay paths) DLYG'1~DLYG'3 using the selectors SEL and the delay fault detecting circuits DET, and stores the detected relationships in the memories. Every time detection is performed, the failure detection unit ERRDU compares the detection result with the magnitude relation stored in the memories, thereby detecting aging deterioration in a plurality of signal delay paths.

As described above, if the failure detecting unit ERRDU is provided in the signal-processing-device SYS'a, the aging deterioration can be detected. However, simply providing the failure detecting unit ERRDU in the device does not necessarily prevent malfunction of the device and secure safety. That is, as described above, it is necessary to take other measures such as duplexing the device and requesting the user to replace the components at an early stage in response to the detection of aging deterioration. As a result, there arise problems such as an increase in cost and shortening of product life due to ensure an excessive margin. Further, in the case of component replacement, it is not always possible to prevent malfunction of the device until replacement is performed, and it is not always possible to secure safety or the like.

Figure 22:
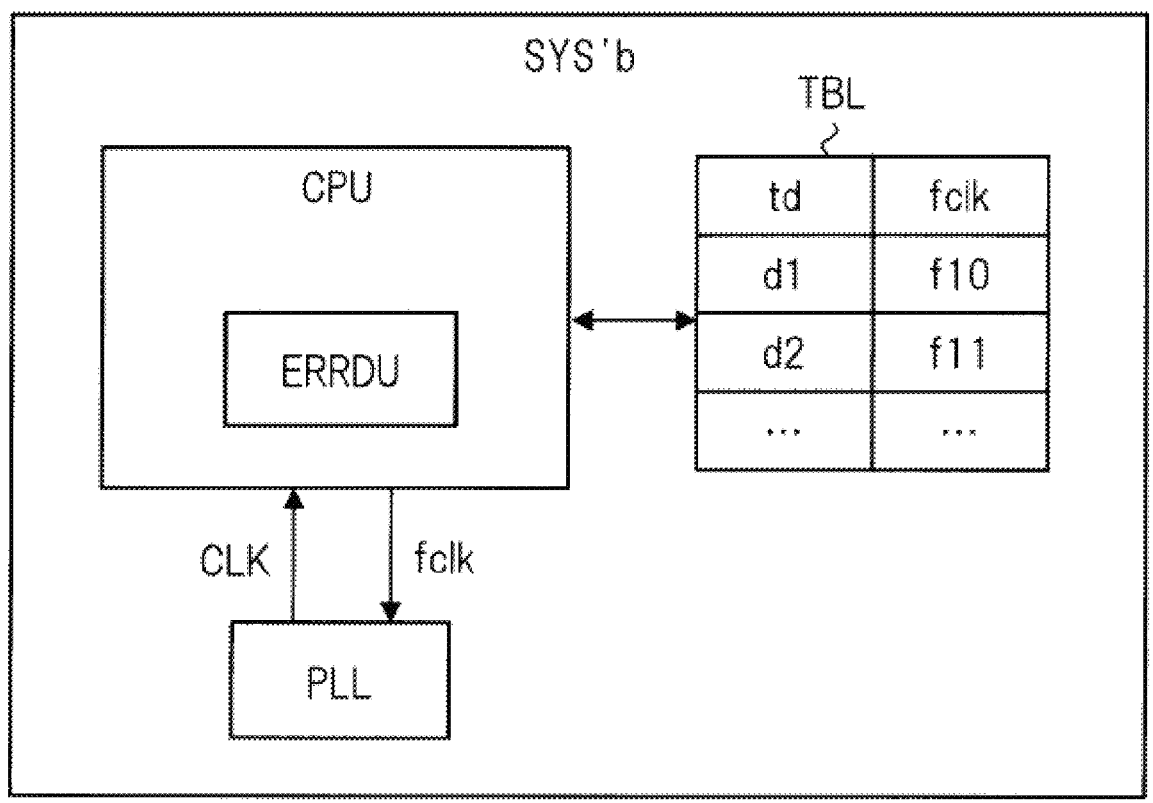
FIG. 22 is a block diagram showing a schematic configuration example of a signal processing device as a second comparative example of the present invention.

FIG. 22 is a block diagram showing a schematic configuration example of a signal processing device as a second comparative example of the present invention. The signal-processing-device SYS'b shown in FIG. 22 includes CPUs, setting tables TBL stored in advance in memories, and PLLs (Phase Locked Loop). The PLL supplies a clock signal CLK to the CPU. The CPUs include, for example, a failure detecting unit ERRDU as shown in FIG. 21. The setting table TBL determines the relationship between the delay time td and the frequency fclk of the clock signal CLK. The CPU acquires the frequency fclk by referring to the setting table TBL based on the delay time td detected by the failure detecting unit ERRDU. Then, the CPU instructs the PLL to perform the frequency fclk, and in response to this, the CPU changes the frequency of the clock signal CLK.

For example, by using such a signal processing device, the same control as that of the signal processing device SYSa of the first embodiment can be performed. However, in the method as shown in FIG. 22, the CPU changes the frequency of its own clock signal CLK at its own judgment based on the detection result of the delay time. In this case, the processing load of the CPU becomes large. On the other hand, in the method of the first embodiment, as shown in FIG. 1, a control loop is provided outside the protection target circuit PRC, which corresponds to the CPU of FIG. 22, and the frequency of the clock signal CLK can be controlled without going through the processing of the protection target circuit PRC. As a result, an increase in the processing load of the protection target circuit PRC can be prevented.

Further, in the method as shown in FIG. 22, although the frequency is controlled according to the detection result of the delay time, the frequency after the modification is not verified in some manner. That is, unlike a closed loop control device in which the state is changed by the control and further control is performed by detecting the change in the state, the device of FIG. 22 is substantially an open loop control device in which the control is terminated by changing the frequency. In this case, the accuracy in controlling the frequency depends on the circuit configuration, the process structure, and the like of the oscillation circuit.

On the other hand, in the method of the first embodiment, the delay time detection circuit DLYDET outputs a signal representing the ratio of the pulse width (time difference) D to the cycle T of the clock signal CLK as the delay amount detection signal Q, as shown in FIG. 3, and the clock control circuit CKCTL controls the frequency of the clock signal CLK based on the delay amount detection signal Q. That is, the delay-time detecting circuit DLYDET can operate by receiving, for example, a pulse signal different from the clock signal CLK, but in this case, the delay-time detecting circuit DLYDET operates by receiving the same clock signal CLK as that of the protection-target circuit RPC. As a result, since the actual frequency (period T) of the clock signal CLK is substantially detected and then the control reflecting the detected frequency (period T) is performed, the frequency (period T) of the clock signal CLK can be controlled with high accuracy regardless of the circuit configuration, the process structure, or the like of the oscillation circuit.

As a specific operation example, for example, as shown in FIG. 3, when the pulse width (time difference) D increases, the duty ratio of the delay amount detection signal Q increases, and the delay amount detection voltage Vcnt decreases based on the gain of the delay amount voltage converter circuit (low-pass filter circuit) DVC in FIG. 4. When the delay detection voltage Vcnt decreases, the clock signal CLK is controlled so that the cycle T of the clock signal CLK extends based on the gain G of the frequency control circuit FCTL of FIG. 8. When the period T increases, the duty ratio of the delay amount detection signal Q decreases, and the delay amount detection voltage Vcnt increases based on the gain of the delay amount voltage converter DVC. When the delay detection voltage Vcnt rises, the delay detection voltage Vcnt is controlled to shorten the period T based on the gain G of the frequency control circuit FCTL.

Thereafter, an operation is repeated in which the delay amount voltage conversion circuit DVC lowers the delay amount detection voltage Vcnt in accordance with the shortening of the period T, the frequency control circuit FCTL extends the period T in response thereto, the delay amount voltage conversion circuit DVC raises the delay amount detection voltage Vcnt in response thereto, and the frequency control circuit FCTL shortens the period T in response thereto. At this time, if the gain of the delay amount voltage converter circuit DVC and the gain G of the frequency control circuit FCTL are appropriately determined, the amounts of change in the delay amount detected voltage Vcnt and the period T are successively reduced in the repetitive process, and the period T (frequency) of the clock signal CLK can be converged to predetermined values.

(Comparison of Product Lifetime between the Method of Embodiment 1 and the Method of the First Comparative Example)

Figure 14:
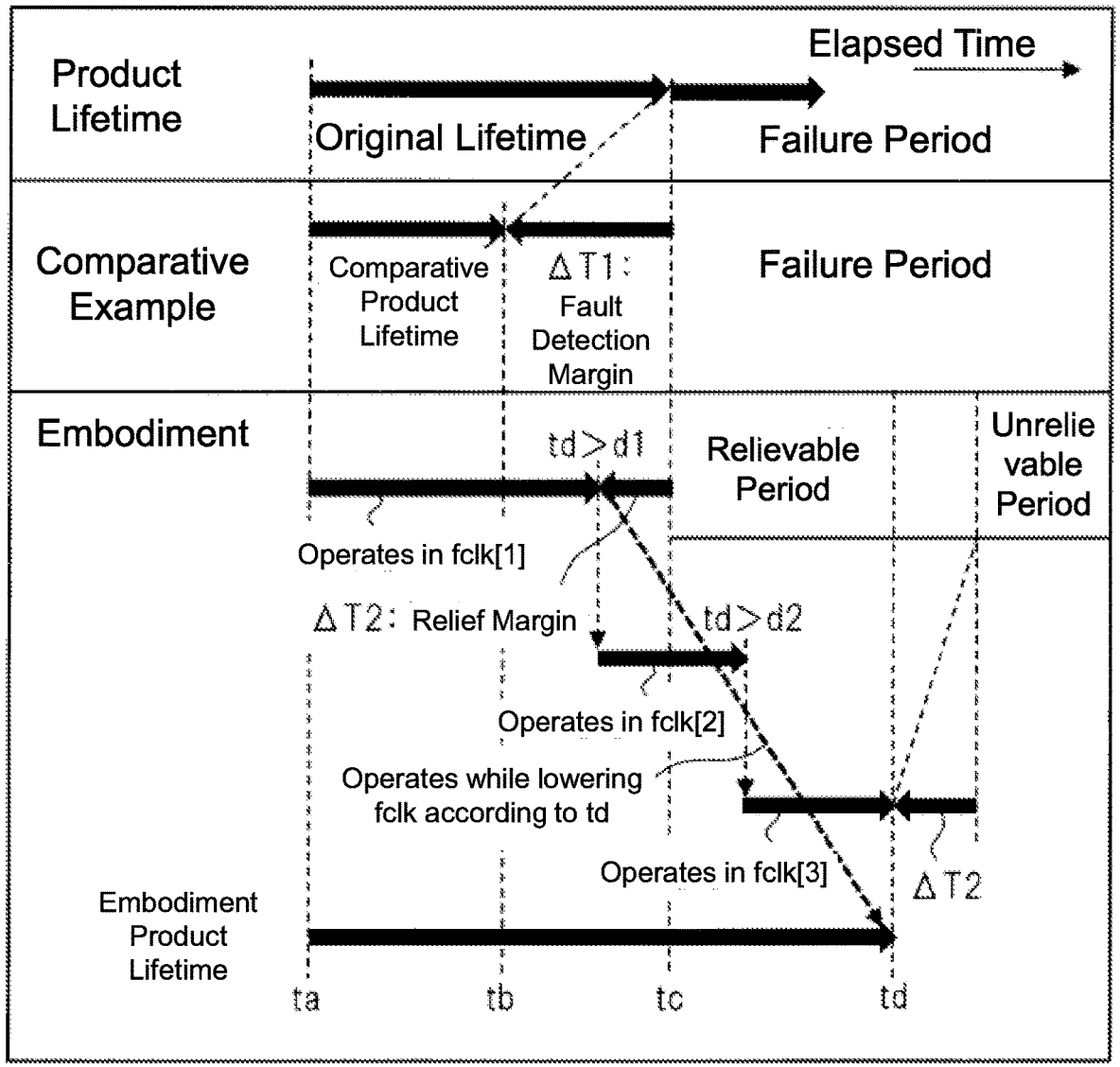
FIG. 14 is a conceptual diagram comparing product lifetimes of the signal processing device of FIG. 1 and the signal processing device of FIG. 21.

FIG. 14 is a conceptual diagram comparing product lifetimes of the signal processing device of FIG. 1 and the signal processing device of FIG. 21. The upper frame of FIG. 14 shows the original product life until a delay failure occurs and the product becomes inoperable. The middle frame of FIG. 14 shows the lifetime of products when the signal-processing device SYS'a of FIG. 21 is used. In the method of the comparative example, it is necessary to detect a delay fault after a sufficient fault detection margin ΔT1 is secured before the operation is disabled. The failure detection margin ΔT1 becomes large particularly when the user is requested to replace the components at an early stage as described with reference to FIG. 21. As a result, the product life is excessively short compared to the original product life.

The lower frame of FIG. 14 shows the lifetime of products when the signal-processing-device SYSa of FIG. 1 is used. In the signal processor SYSa of FIG. 1, the frequency fclk of the clock signal CLK is automatically adjusted while the minimum relief margin ΔT2 corresponding to the relief margin voltage ΔV of FIG. 6 is secured in accordance with the increase in the delay time td of the protective circuit PRC. The remedy margin ΔT2, for performing remedies by automatically adjusting the frequency fclk, may be less than the fault detection margin ΔT1 in the method of at least the comparative example.

The lower frame of FIG. 14 shows the case of continuously automatically adjusting the frequency fclk in accordance with the delay time td and the case of automatically adjusting the frequency in a stepwise manner. The case of the stepwise automatic adjustment corresponds to the case where part or all of the signal processing device is configured by a digital circuit as described above. Here, in order to facilitate understanding, description will be made on the assumption that automatic adjustment is performed stepwise. First, immediately after the product starts to be used (i.e., in a state in which a delay failure has not occurred), the signal-processing-device SYSa sets the frequency fclk to the first frequency fclk[1]. Thereafter, when the delay time td reaches the first reference time d1, the signal-processing-device SYSa automatically adjusts the frequency fclk, thereby starting the remedy. The reference quantity d1 corresponds to, for example, the deterioration delay time "td0" in FIG. 12.

When the delay time td reaches the first reference value D1, the signal-processing-device SYSa lowers the frequency fclk to a second frequency fclk[2] lower than the first frequency fclk[1]. Thereafter, when the delay time td reaches the second reference amount d2 which is larger than the first reference amount d1, the signal-processing-device SYSa lowers the frequency fclk to the third frequency fclk[3] which is lower than the second frequency fclk[2]. Thereafter, in the same manner, the automatic frequency adjustment is performed toward the lower limit frequency at which the reduction of the processing capacity is allowed, and the automatic frequency adjustment is finished when the relief margin ΔT2 is added to the lower limit frequency.

Here, for example, when the protection target circuit RPC operates at the second frequency fclk [2], even if the delay time td between the reference amounts d1 to d2 occurs, the malfunction of the protection target circuit RPC does not occur. That is, the reference amounts d1 and d2 are preset to values having a minimum margin with respect to the delay time td which causes a malfunction when the protected circuit RPC is operated at the second frequency fclk [2].

For example, if the delay time immediately after the start of use in the protective circuit RPC is "td[0]" and the time of 1% of the cycle T of the clock signal CLK corresponding to the first frequency fclk[1] is "Δtc[1]", the reference quantity d1 is determined to be, for example, "td[0]+Δtc[1]" or the like. Similarly, when the period T of the clock signal CLK corresponding to the second frequency fclk[2] is 1% of the period T of the clock signal CLK, the reference quantity d2 is determined to be, for example, "d1+Δtc[2]" or the like. In this case, the relief margin ΔT2 in FIG. 14 becomes sufficiently large, and the margin against the malfunction can be sufficiently secured.

The reference amounts d1 and d2 may be determined to be 10% of the time instead of 1% of the time of the cycle T of the clock signal CLK. In this case, although the margin for the malfunction is small, the protection target circuit RPC can be operated at a higher frequency, and thus, a decrease in the processing capacity can be suppressed. In addition, the frequency of switching the frequency of the clock signal CLK can be reduced, and the operation of the signal processing device can be stabilized.

(Effects of Embodiment 1)

As described above, by using the signal processing device of the first embodiment, it is possible to prevent a malfunction, typically, even when a delay failure due to aging occurs. In addition, when the signal processing device is applied to a device requiring safety such as an automobile or the like, it is possible to maintain safety substantially equivalent to that at the time of normal operation. That is, although the processing capability is lowered by lowering the frequency fclk of the clock signal CLK, it is possible to prevent malfunctions such as operation errors and logical runaway and to maintain security within a range in which the processing capability is allowed to be lowered. Further, as described in FIG. 22, such an effect can be obtained without increasing the processing load of the protection target circuit PRC.

Further, in another aspect, as described in FIG. 14, it is possible to effectively extend the life of the product. As a result, the cost can be reduced. This cost reduction effect can also be obtained because the duplexing of the device or the like becomes unnecessary.

Although the increase of the delay time with the aging has been described as a problem here, the increase of the delay time can also be caused by variations of various environmental parameters such as, for example, the power supply voltage and the ambient temperature. For example, if the power supply voltage varies, ±10% of the rated voltage, and if the ambient temperature Ta varies, Ta varies from −40° C. to 125° C. At the stage of device design and circuit design, it is usually necessary to take such variations into consideration to ensure a sufficient safety margin.

On the other hand, when the signal processing device of the first embodiment is used, even when the delay time is increased due to such a variation in the environmental parameter, the delay time can be reduced by decreasing the frequency fclk of the clock signal CLK. As a result, the safety margin required at the stage of device design and circuit design can be relaxed, and the design can be facilitated accordingly. Further, since the safety margin can be relaxed not only in the design stage but also in the manufacturing stage, the production yield of the signal processing device can be improved.

Embodiment 2

(Operation of the Signal Processing Device (Embodiment 2))

Figure 15:
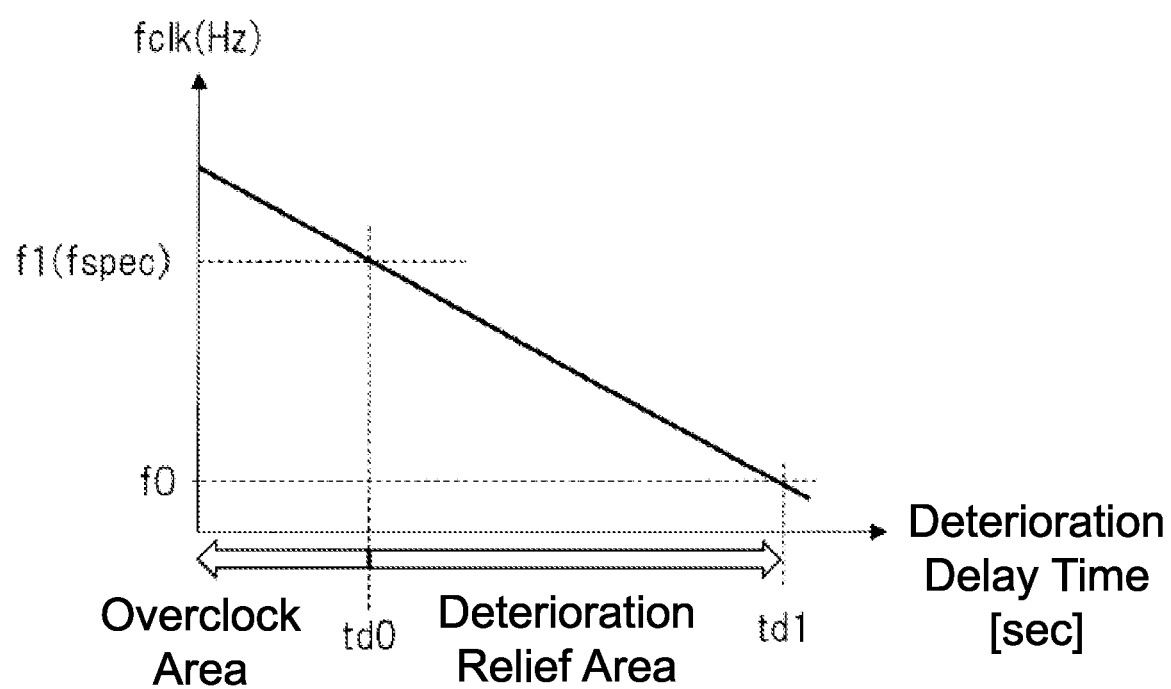
FIG. 15 is a diagram showing an example of the frequency characteristic of the clock signal with respect to the deterioration delay time detected by the delay time detection circuit in the signal processing device according to the second embodiment of the present invention.

FIG. 15 is a diagram showing an example of the frequency characteristic of the clock signal with respect to the deterioration delay time detected by the delay time detection circuit in the signal processing device according to the second embodiment of the present invention. The configuration of the signal processing device according to Embodiment 2 is the same as that of Embodiment 1. In the characteristic shown in FIG. 15, the normal area in FIG. 12 is replaced with an overclock area. In the over-clock domain, the clock control circuit CKCTL of FIG. 1 generates a frequency control signal Vcs for increasing the frequency fclk of the clock signal CLK in accordance with the reduction of the deterioration delay time.

That is, the frequency fclk of the clock signal CLK is set to a prescribed frequency f1 (fspec) based on the specifications of the product in the normal area of FIG. 12, but is set to a value exceeding the prescribed frequency f1 (fspec) in the overclock area of FIG. 15. The delay time of the protection target circuit PRC generally decreases when the power supply voltage increases, when the ambient temperature decreases, or the like. As the delay time decreases, the protective circuit PRC can operate at a higher speed. Therefore, in such cases, by increasing the frequency fclk of the clock signal CLK, the throughput of the protective circuit PRC can be improved.

Embodiment 3

(Outline of the Signal Processing Device (Embodiment 3))

Figure 16:
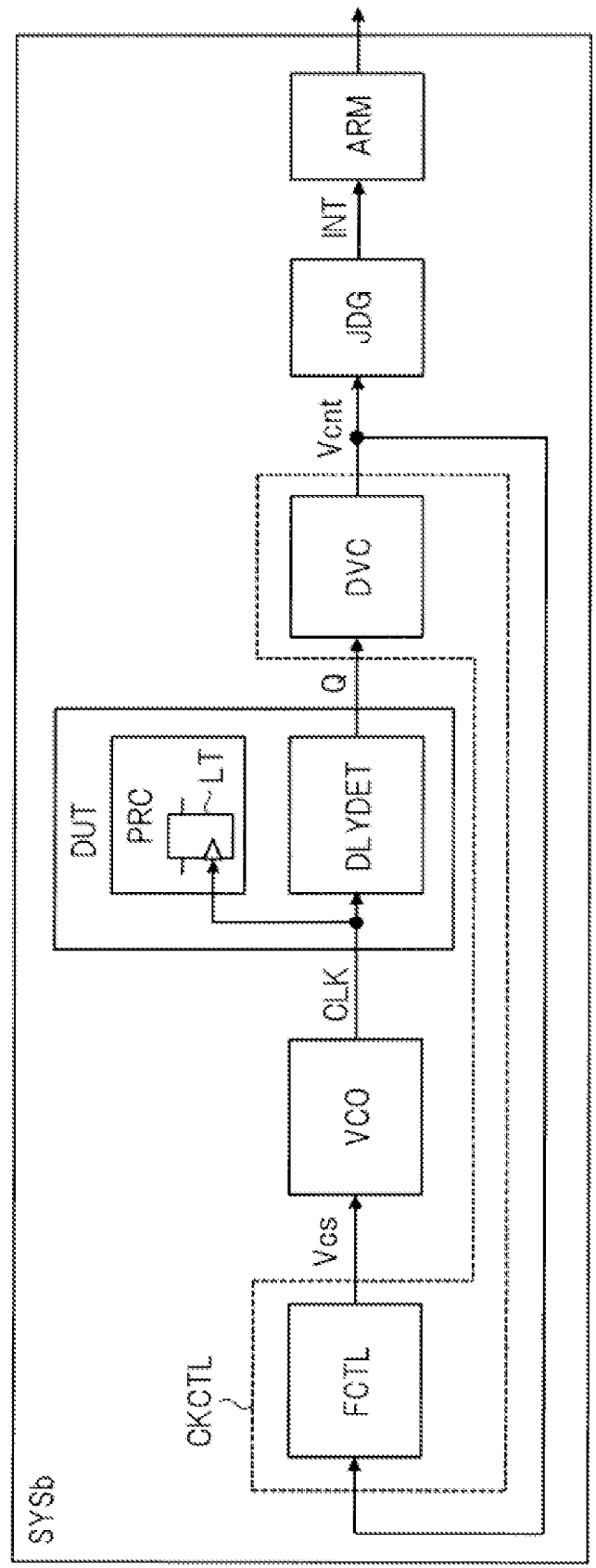
FIG. 16 is a block diagram showing a schematic configuration example of a signal processing device according to Embodiment 3 of the present invention.

FIG. 16 is a block diagram showing a schematic configuration example of a signal processing device according to Embodiment 3 of the present invention. The signal processing device SYSb shown in FIG. 16 further includes a deterioration determination circuit JDG and a warning generation circuit ARM, which are different from the signal processing device SYSb shown in FIG. 1. When the delay time based on the delay detection signal Q of the delay time detection circuit DLYDET is larger than a predetermined reference value, the deterioration determination circuit JDG generates a deterioration detection signal INT indicating the deterioration of the device. In this embodiment, the deterioration determination circuit JDG recognizes the delay time based on the delay amount detected voltage Vcnt from the delay amount voltage converter circuit DVC. The warning generation circuit ARM outputs a warning signal to the outside of the device in response to the deterioration detection signal INT.

Specifically, the deterioration detecting signals INT are generated in the deterioration relieving area (the area of the deterioration delay time td0~td1) shown in FIG. 12. Thus, the deterioration detecting signal INT, it means that a state in which the life is prolonged by suppressing the frequency fclk of the clock signal CLK with deterioration. The signal-processing device SYSb of FIG. 15 is composed of one semiconductor chip, for example, in order to enable miniaturization of the signal-processing device and mass-production of the semiconductor chip. However, the signal processing device SYSb is not limited to this, and the signal processing device SYSb may be configured by a plurality of semiconductor chips.

(Details of the Deterioration Determination Circuit)

Figure 17:
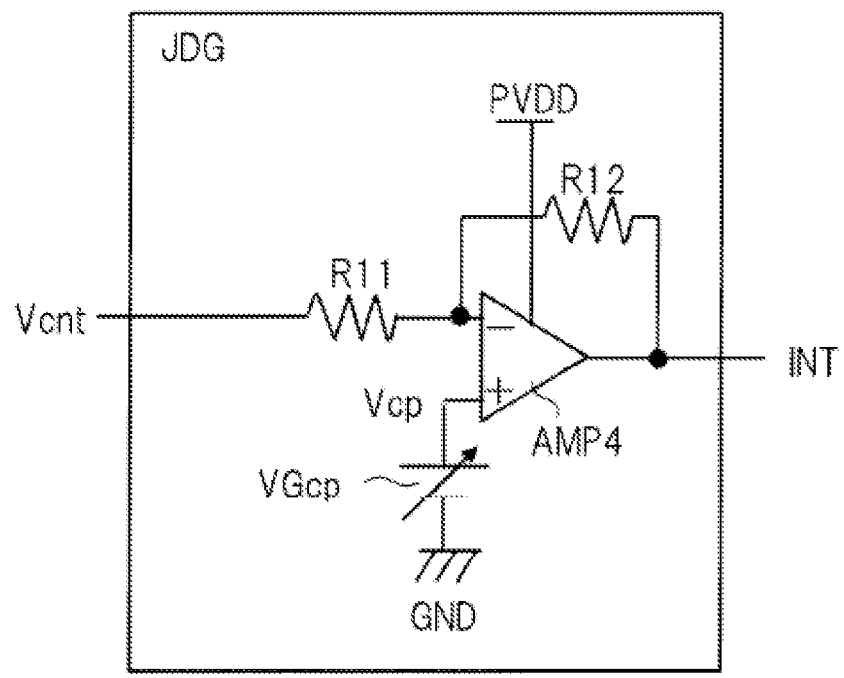
FIG. 17 is a circuit diagram showing a configuration example of a deterioration determination circuit in the signal processing device of FIG. 16.

FIG. 17 is a circuit diagram showing a configuration example of a deterioration determination circuit in the signal processing device of FIG. 16. In this embodiment, the deterioration judging circuit JDG of FIG. 17 is an inverting amplifier including an operational amplifier AMP4, a resistor R11, a feedback resistor R12, and a variable voltage source VGcp. The variable voltage source VGcp generates a reference voltage Vcp. For example, by setting the gain to be large according to the ratio of the resistors R11 and R12, the inverting amplifiers function as comparator circuits that comparative and determine the magnitude relation between the reference voltage Vcp and the delay detecting voltage Vcnt. Here, the reference voltage Vcp can be appropriately variably set. For this reason, the deterioration determination circuit JDG can detect the degree of the deterioration delay time in a plurality of stages in the deterioration relief area of FIG. 12, for example.

The warning circuit ARM shown in FIG. 16 includes, for example, an external computer or an interface circuit for communicating with the host control device CSYS in the vehicle control device VHC described with reference to FIG. 19. The warning circuit ARM may include, for example, a circuit for lighting a warning lamp in response to the deterioration detection signal INT, a circuit for generating a warning sound, or the like. For example, when the driver of the vehicle hears the lighting of the warning lamp or the warning sound, it can be known that the signal processing device is deteriorated and the frequency of the clock signal CLK is lowered to prolong the life of the vehicle. Further, in some cases, the driver may request replacement of parts or the like at a step when the driver knows the life extending state.

(Control Flow of Signal Processing Device (Embodiment 3))

Figure 18:
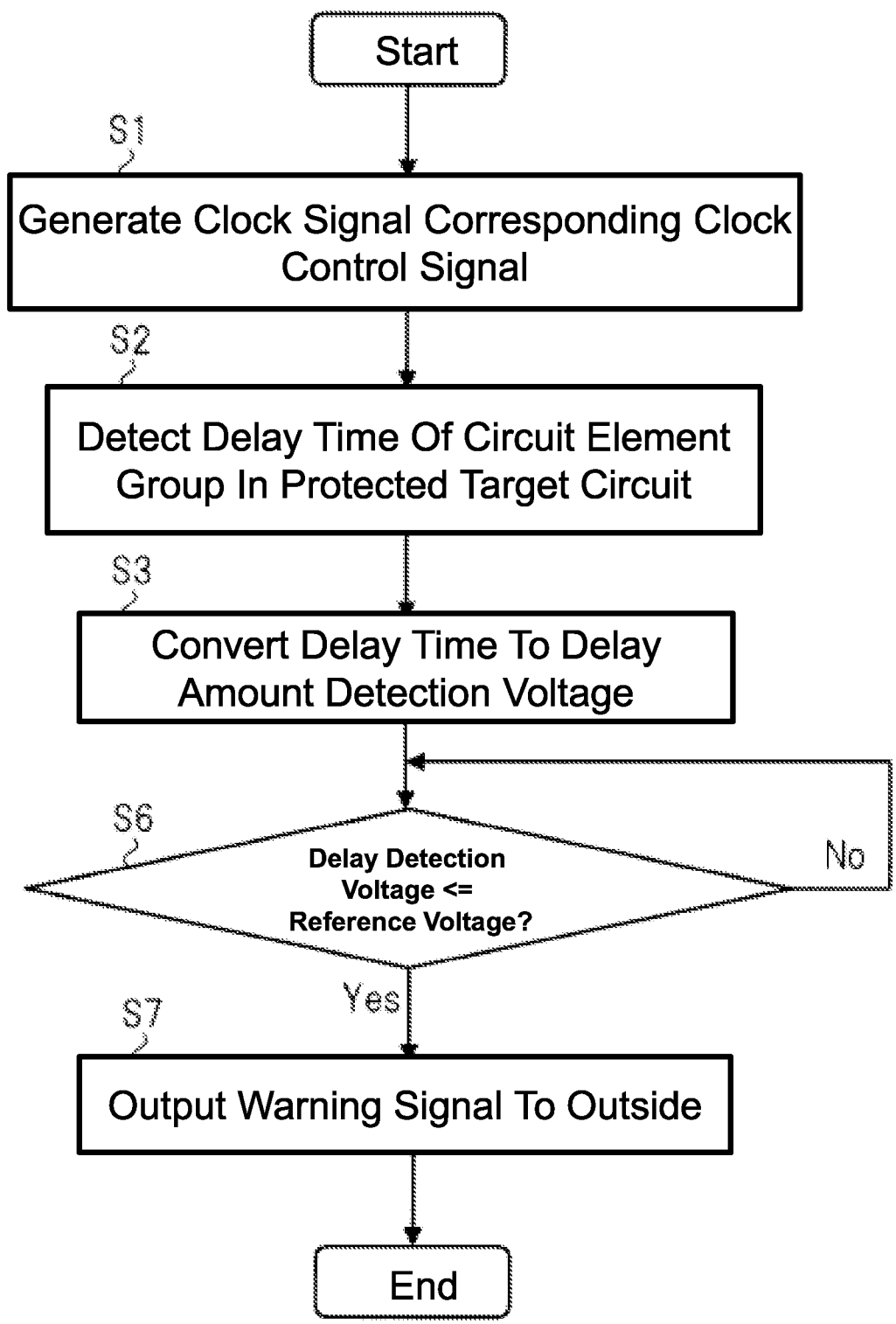
FIG. 18 is a flowchart showing an example of a control procedure in the control method of the signal processing device according to the third embodiment of the present invention.

FIG. 18 is a flowchart showing an example of a control procedure in the control method of the signal processing device according to the third embodiment of the present invention. In the flow shown in FIG. 18, after the control of steps S1 to S3 shown in FIG. 13, the control of steps S6 and S7 is performed. In step S6, the deterioration determination circuit JDG compares the delay amount detection voltage Vcnt converted in step S3 with a predetermined reference voltage Vcp, and when the delay amount detection voltage Vcnt reaches the reference voltage Vcp, the deterioration determination circuit JDG generates a deterioration detection signal INT indicating deterioration of the device. Thereafter, in step S7, the warning circuit ARM outputs a warning signal to the outside in response to the deterioration detection signal INT.

(Configuration of Vehicle Control Device)

Figure 19:
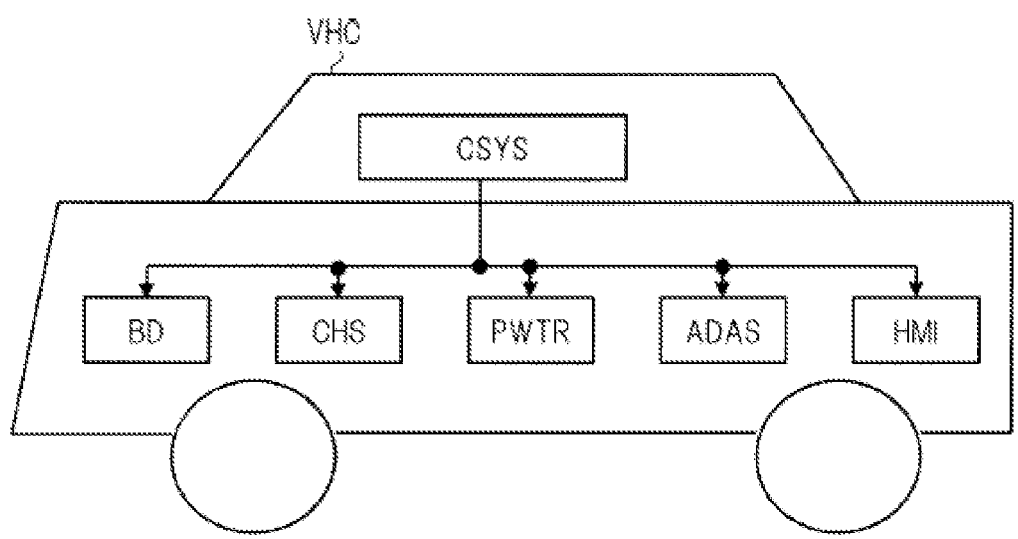
FIG. 19 is a block diagram showing a configuration example of a vehicle control device to which the signal processing device of FIG. 16 is applied.

FIG. 19 is a block diagram showing a configuration example of a vehicle control device to which the signal processing device of FIG. 16 is applied. The vehicle control device VHC shown in FIG. 19 includes a host control device CSYS, a body device BD, a chassis device CHS, a powertrain device PWTR, an advanced automated driving device ADAS, and a human-machine interface HMI. The signal-processing device SYSb of FIG. 16 is applied to any device except for the upper control device CSYS, for example. In this instance, the upper control device CSYS receives warning signals from the warning circuits ARMs mounted on any one of the devices, and performs control such as, for example, adjusting the velocity of the entire device.

The signal-processing device SYSb of FIG. 16 may of course be applied to the upper control device CSYS, or may be applied to other devices (not shown) in the vehicle-control device VHC. Although the signal processing device SYSb shown in FIG. 16 is applied to the vehicle control device VHC here, the signal processing device SYSa shown in FIG. 1 may be applied to the vehicle control device VHC.

(Effects of Embodiment 3)

As described above, by using the signal processing device of Embodiment 3, in addition to the various effects described in Embodiments 1 and 2, it is possible to inform the host device and the user that the signal processing device is extending the life beyond the normal life. As a result, the host device can prevent the entire device from malfunctioning and enhance safety by, for example, performing an adjustment with another device. In addition, since the safety of the protection target circuit PRC is secured to some extent by the above-described deterioration relief, the user can request the replacement of parts or the like with sufficient time even when receiving the warning signal. Such an effect is particularly advantageous in the vehicle control device VHC as shown in FIG. 19.

Embodiment 4

(Outline of the Signal Processing Device (Embodiment 4))

Figure 20:
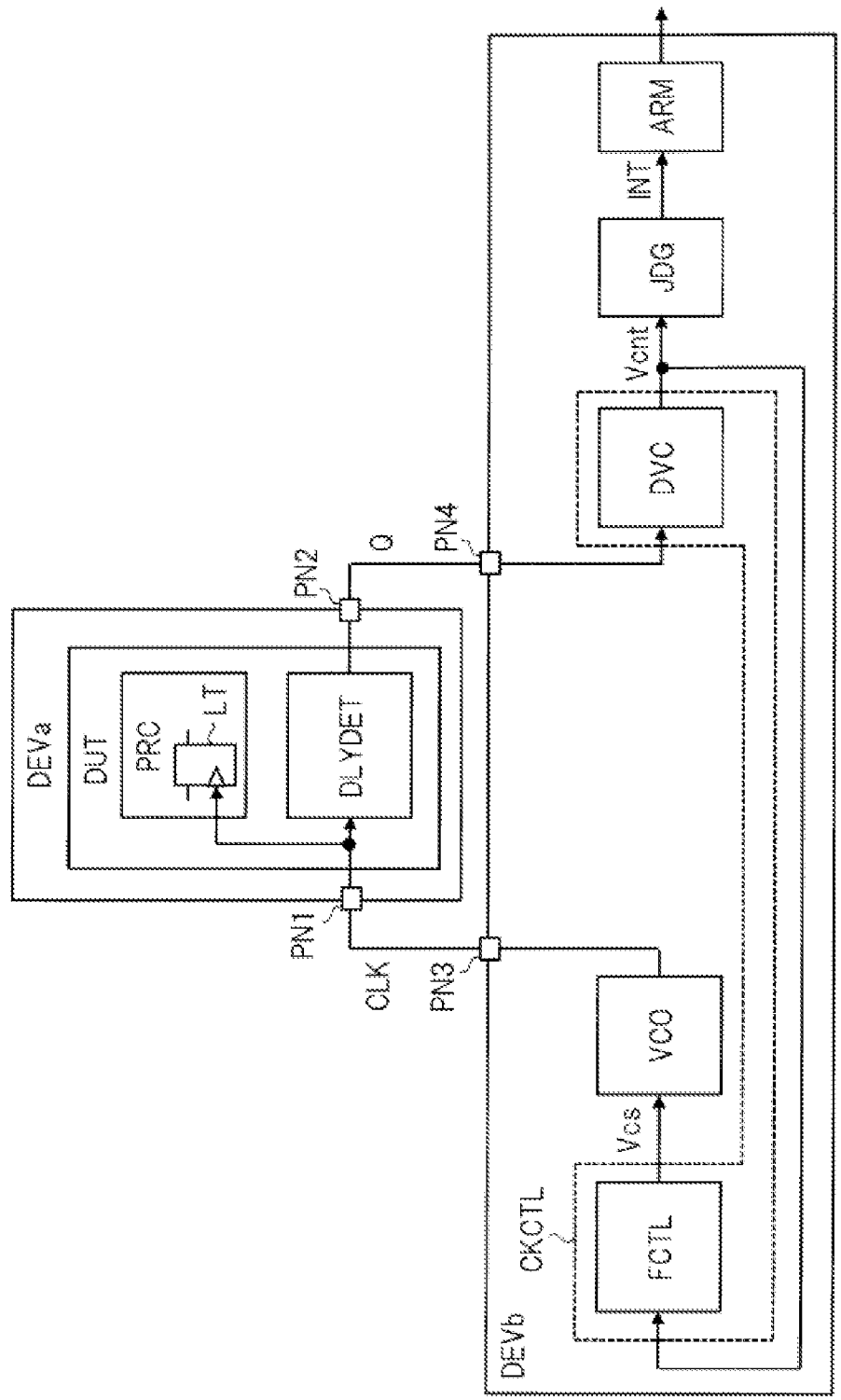
FIG. 20 is a block diagram showing a schematic configuration example of a signal processing device according to Embodiment 4 of the present invention.

FIG. 20 is a block diagram showing a schematic configuration example of a signal processing device according to Embodiment 4 of the present invention. The signal processing device shown in FIG. 20 is a configuration example in which the implementation is limited to the configuration example in FIG. 16. In FIG. 20, the circuit-to-be-tested DUTs including the circuit-to-be-protected PRC and the delay-time detecting circuit DLYDET are mounted on the same semiconductor chip (semiconductor device DEVa). On the other hand, the oscillating circuit VCO, the clock control circuit CKCTL, the deterioration determination circuit JDG, and the warning circuit ARM, which are to be the rest of the oscillating circuit VCO, are mounted on the semiconductor device DEVb outside the semiconductor chip (semiconductor device DEVa). The semiconductor device DEVb is composed of, for example, one semiconductor chip.

The semiconductor device DEVa includes an external terminal PN1 to which the clock signal CLK is inputted and an external terminal PN2 to which the delay detecting signal Q is outputted. The semiconductor device DEVb includes an external terminal PN3 for outputting the clock signal CLK to the external terminal PN1 of the semiconductor device DEVa, and an external terminal PN4 for receiving the delay detecting signal Q from the external terminal PN2 of the semiconductor device DEVa.

(Effects of Embodiment 4)

As described above, when the signal processing device of Embodiment 4 is used, in addition to the various effects described in Embodiments 1 to 3 being obtained, it is possible to effectively utilize the existing apparatus to improve the versatility of the device. That is, the semiconductor device DEVa may be any of various conventional semiconductor devices as long as the semiconductor device has the same function as that of the delay detecting circuit DLYDET. By adding the semiconductor device DEVb to the conventional semiconductor device, various methods described in Embodiments 1 to 3 can be realized.

Although the invention made by the present inventor has been specifically described based on the embodiment, the present invention is not limited to the embodiment described above, and various modifications can be made without departing from the gist thereof. For example, the above-described embodiments have been described in detail in order to easily understand the present invention, and are not necessarily limited to those having all the configurations described. In addition, a part of the configuration of one embodiment can be replaced with the configuration of another embodiment, and the configuration of another embodiment can be added to the configuration of one embodiment. It is also possible to add, delete, or replace some of the configurations of the respective embodiments.

What is claimed is:

1. A signal processing device comprising:
   an oscillation circuit configured to receive a frequency control signal and generate a clock signal whose frequency is variable based on the frequency control signal;
   a protection target circuit configured to operate based on the clock signal;
   a delay time detection circuit including a test circuit corresponding to a configuration of a predetermined circuit in the protection target circuit, the delay time detection circuit being configured to detect a delay time of a signal generated in the test circuit and output a delay amount detection signal based on the delay time; and
   a clock control circuit provided external of the protection target circuit, the clock control circuit being configured to receive the delay amount detection signal and generate the frequency control signal,
   wherein the frequency control signal for declining the frequency of the clock signal in response to an increase in the delay time.

2. The signal processing device according to claim 1, wherein the clock control circuit generates the frequency control signal that continuously changes the frequency of the clock signal in response to the delay time.

3. The signal processing device according to claim 1, wherein the delay time detection circuit detects a time difference between the clock signal and a delayed clock signal obtained by delaying the clock signal by the test circuit, and outputs a signal representing a ratio of the time difference to a cycle of the clock signal as the delay amount detection signal.

4. The signal processing device according to claim 3,
   wherein the delay time detection circuit includes a logical operation circuit, and
   wherein the logical operation circuit performs a logic operation using the clock signal and the delayed clock signal as inputs, and outputs a signal having a pulse width based on the time difference at the same frequency as the clock signal as the delayed amount detection signal.

5. The signal processing device according to claim 4, wherein the clock control circuit includes a filter circuit configured to smooth the delay amount detection signal, and generates the frequency control signal based on an output voltage of the filter circuit.

6. The signal processing device according to claim 5, wherein the clock control circuit further comprises:
   a gain adjustment circuit for amplifying an output voltage of the filter circuit with a predetermined gain; and
   a level shift circuit for generating the frequency control signal by adjusting a bias level with respect to an output voltage of the gain adjustment circuit.

7. The signal processing device according to claim 1, wherein the clock control circuit generates the frequency control signal that increases the frequency of the clock signal in response to a decrease in the delay time.

8. The signal processing device according to claim 1, further comprising a deterioration determination circuit configured to generate a deterioration detection signal indicating deterioration of the device when the delay time when the delay amount detection signal is larger than a predetermined reference value.

9. The signal processing device according to claim 1, wherein the protection target circuit, the delay time detection circuit, the oscillation circuit, and the clock control circuit are disposed on the same semiconductor chip.

10. A method for controlling a signal processing device, the method comprising:
    generating a clock signal having a frequency corresponding to a frequency control signal;
    outputting a delay amount detection signal based on a delay time of signal transfer in a protection target circuit;
    generating a delay amount detection voltage having a voltage corresponding to a pulse width of the delay amount detection signal; and
    controlling the frequency control signal so that the frequency of the clock signal based on the delay amount detection signal.

11. The method according to claim 10, wherein the controlling comprises continuously changing the frequency of the clock signal according to delay time.

12. The method according to claim 10,
wherein the outputting of the delay amount detection signal comprises generating a delayed clock signal obtained by delaying the clock signal by the protection target circuit, and
wherein the delay amount detection signal has a duty ratio corresponding to a time difference between the clock signal and the delayed clock signal.

13. The method according to claim 10, further comprising:
generating a deterioration detection signal indicating deterioration of the signal processing device when the delay amount detection voltage reaches a predetermined reference voltage.

14. The method according to claim 13, further comprising:
outputting a warning signal in response to the deterioration detection signal.

* * * * *